(12) United States Patent
Hiebert et al.

(10) Patent No.: US 9,229,433 B1
(45) Date of Patent: Jan. 5, 2016

(54) SYSTEM AND METHOD FOR SYNCHRONIZING LOCAL OSCILLATORS

(71) Applicant: PMC-SIERRA US, INC., Sunnyvale, CA (US)

(72) Inventors: Mark Hiebert, New Westminster (CA); Derek J. W. Ho, Vancouver (CA)

(73) Assignee: PMC-SIERRA US, INC., Sunnyvale, CA (US)

( * ) Notice: Subject to any disclaimer, the term of this patent is extended or adjusted under 35 U.S.C. 154(b) by 0 days.

(21) Appl. No.: 14/552,241

(22) Filed: Nov. 24, 2014

Related U.S. Application Data

(62) Division of application No. 13/910,016, filed on Jun. 4, 2013.

(51) Int. Cl.
*H03M 1/50* (2006.01)
*G04F 10/00* (2006.01)
*H03M 1/12* (2006.01)
*H04L 7/033* (2006.01)
*H03M 1/00* (2006.01)

(52) U.S. Cl.
CPC ............ *G04F 10/005* (2013.01); *H03M 1/1255* (2013.01); *H04L 7/0331* (2013.01); *G04F 10/00* (2013.01); *H03M 1/00* (2013.01); *H03M 1/12* (2013.01); *H03M 2201/4233* (2013.01)

(58) Field of Classification Search
CPC . H03M 2201/4233; H03M 1/12; H03M 1/00; G04F 10/00
USPC .................... 341/166, 155, 156, 120; 368/120
See application file for complete search history.

(56) References Cited

U.S. PATENT DOCUMENTS

| | | | |
|---|---|---|---|
| 6,870,503 B2 | 3/2005 | Mohamadi | |
| 7,571,359 B2 | 8/2009 | Gutnik et al. | |
| 7,860,190 B2 | 12/2010 | Feller | |
| 7,986,190 B1 | 7/2011 | Lye | |
| 8,139,701 B2 | 3/2012 | Nedovic | |
| 8,204,143 B2 | 6/2012 | Ravid et al. | |
| 2003/0071668 A1 | 4/2003 | Starr | |
| 2007/0098047 A1 | 5/2007 | Iida | |
| 2009/0296532 A1* | 12/2009 | Hsieh | 368/120 |
| 2011/0090998 A1 | 4/2011 | Zhang | |

OTHER PUBLICATIONS

U.S. Appl. No. 13/910,016, Office Action dated Jan. 26, 2015.

* cited by examiner

*Primary Examiner* — Joseph Lauture
(74) *Attorney, Agent, or Firm* — Dennis R. Haszko

(57) ABSTRACT

Provided is a method and apparatus for aligning a first local oscillator (LO) clock generated by a controllable LO clock generator in a first radio frequency (RF) path with a second LO clock in a second RF path. The apparatus includes a synchronization channel configured to exchange a synchronization clock between the first and second RF paths, a phase detector configured to measure a phase alignment between the first and second LO clocks, and a loop filter configured to drive the controllable LO clock generators using the phase alignment. Also provided is a time to digital converter. The time to digital converter includes a D flip-flop for sampling first and second input clocks with a third clock, and a counter configured to synchronously increment the resulting samples and create a digital proportional value representing the delay between the first and second clocks.

12 Claims, 19 Drawing Sheets

SYSTEM AND METHOD FOR SYNCHRONIZING LOCAL OSCILLATORS

CROSS REFERENCE TO RELATED APPLICATIONS

This application is a divisional of U.S. patent application Ser. No. 13/910,016 filed on Jun. 4, 2013, which is incorporated herein by reference in its entirety.

FIELD

The present disclosure relates generally to the synchronization of local oscillators in radio frequency systems, specifically in radio frequency systems that include multiple radio frequency paths and multiple antennas. More particularly, the present disclosure relates to alignment of multiple local oscillator clock sources between multiple radio frequency paths that are spread across a physical distance.

BACKGROUND

When building radio frequency (RF) systems that involve multiple antennas, such as multiple input/multiple output (MIMO) or active antenna systems (AAS), a critical design constraint is that the local oscillator (LO) clocks attached to the RF circuits attached to each antenna are synchronized in phase. This phase synchronization of the LOs allows, through constructive and destructive techniques, the resulting RF signals to be processed spatially. This spatial processing may allow for redundancy, increased effective bandwidth, optimized coverage through beam forming, and some combination thereof.

If the LOs are not synchronized in phase, spatial processing of the RF signals is still possible where the delays (or phases) of the LOs associated with each antenna are calibrated. The calibration of the antennas may be costly, either in time or in equipment, especially where the possible delay (or phase) of each LO can effectively be completely arbitrary. In addition, the LO phases drift with respect to each LO over time and in response to environmental conditions (such as voltage, temperature, humidity, and the like) may limit the usefulness of any initial phase calibration and may mandate that additional techniques, such as periodic calibration or background calibration, be performed.

It is, therefore, desirable to provide a system and method for synchronizing local oscillators.

BRIEF DESCRIPTION OF THE DRAWINGS

Embodiments of the present disclosure will now be described, by way of example only, with reference to the attached Figures.

DETAILED DESCRIPTION

Figure 1:
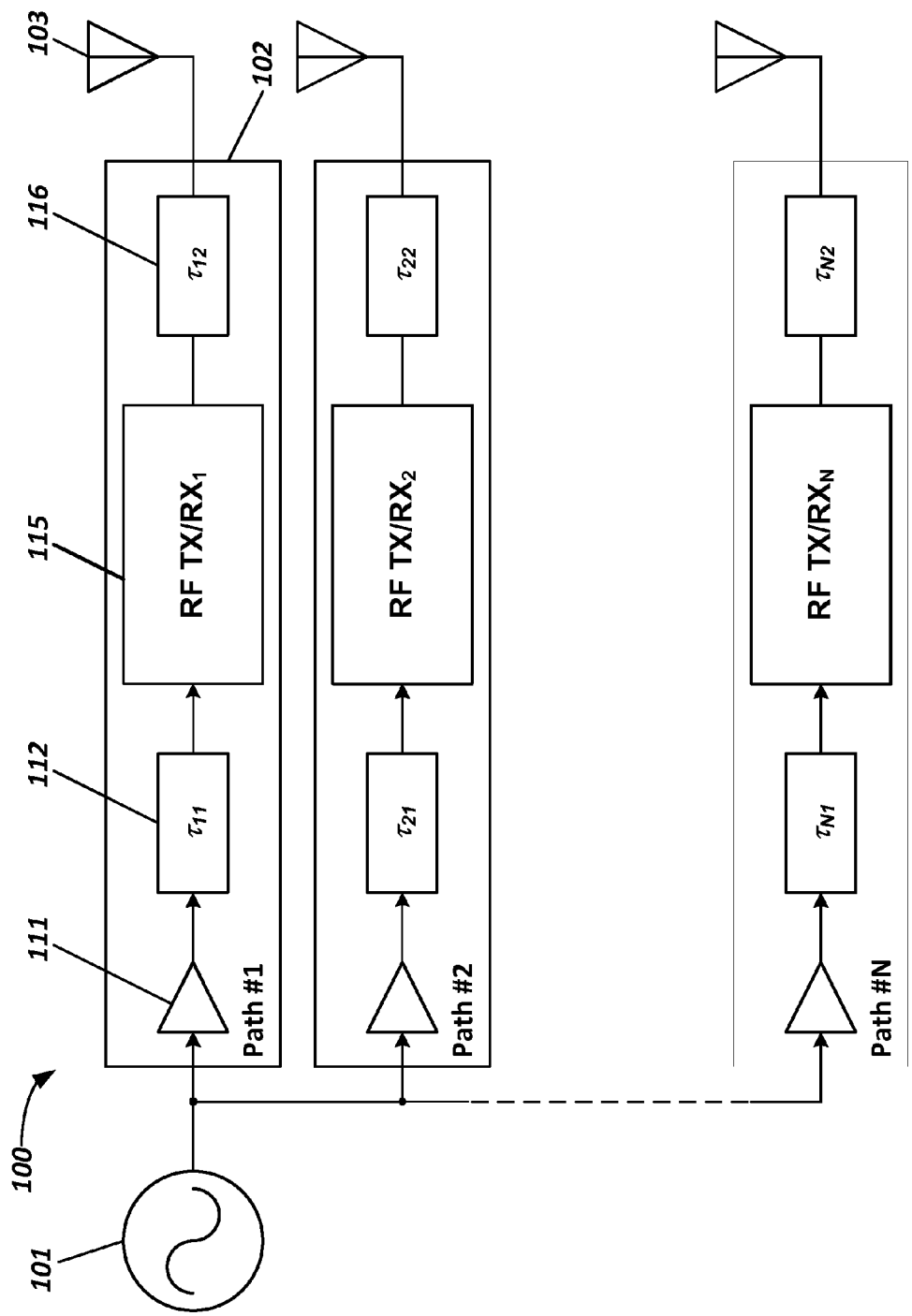
FIG. 1 is a single local oscillator multiple antenna system.

Generally, the present disclosure provides a multiple-local oscillator multi-antenna RF system having a mechanism to align phases of multiple LO clock generators that are potentially distributed across multiple cards plugged into a common backplane. Implementations of the disclosure can provide a reduction in cost in producing large RF systems that contain multiple RF paths with multiple antennas.

A method is disclosed that allows for the synchronization of multiple local oscillator (LO) clock sources spread across a large radio frequency (RF) system, such as a multiple-input/multiple-output (MIMO) or active antenna system (AAS), without a centralized LO clock source, reducing the cost and complexity of constructing such a system. The method builds upon already-existing blocks in the system, requiring a relatively small additional circuit be added to each LO clock source. The method can be readily applied both to single-board systems and to modular systems containing multiple printed circuit boards and connectors, and can scale from small systems where there are as few as two LO clock sources to be synchronized to large systems where there are many more LO clock sources to be synchronized. Multiple techniques are disclosed for synchronizing the multiple LO clock sources when building large systems.

It is an object of the present disclosure to obviate or mitigate at least one disadvantage of previous methods for aligning local oscillators.

In a first aspect, the present disclosure provides an apparatus for aligning a first local oscillator (LO) clock generated by a controllable LO clock generator in a first radio frequency (RF) path with a second LO clock in a second RF path. The apparatus includes a synchronization channel configured to exchange a synchronization clock between the first and second RF paths, a phase detector configured to measure a phase alignment between the first and second LO clocks, and a loop filter configured to drive the controllable LO clock generator using the phase alignment.

In further aspect, the RF paths include a low-bandwidth phase locked loop and wherein the loop filter is further configured to manipulate a phase of the low-bandwidth phase locked loop to align the first and second LO clocks.

In further aspect, the apparatus includes a first printed circuit board (PCB) trace or connector configured to pass a first full rate clock from the first RF path to the second RF path, and a second PCB trace or connector configured to pass a second full rate clock from the second RF path to the first RF path. The phase detector is configured to measure a relative phase of the first and second full rate clocks.

In further aspect, the apparatus includes a first PCB trace or connector configured to pass a first low rate clock from the first RF path to the second RF path, and a second PCB trace or connector configured to pass a second low rate clock from the second RF path to the first RF path. The phase detector is configured to measure a relative phase of the first and second low rate clocks.

In further aspect, the first and second low rate clocks are synchronously generated and aligned to first and second full rate clocks.

In further aspect, the apparatus includes a PCB trace or connector configured to pass, in a time interleaved manner, first and second full rate clocks of the first and second RF paths between the first and second RF paths. The phase detector is configured to measure a relative phase of the first and second full rate clocks.

In further aspect, the apparatus includes a PCB trace or connector configured to pass, in a time interleaved manner, first and second low rate clocks of the first and second RF paths between the first and second RF paths. The phase detector is configured to measure a relative phase of the first and second low-rate clocks.

In further aspect, the first and second low rate clocks are synchronously generated and aligned to first and second full rate clocks.

In further aspect, an output from the phase detector is determined from three time-interleaved measurements. The apparatus further includes at least one replica receive buffer configured to cancel systematic and environmental variability due to receive and transmit buffers.

In further aspect, the first RF path includes the first phase detector and the second RF path includes a second phase detector, the outputs from the first and second phase detectors are subtracted at the input of the loop filter. A true phase relationship between the first and second LO clocks is determined. Systematic and environmental variability due to transmit buffers is cancelled.

In further aspect, the apparatus for aligning first and second local oscillator clocks includes separate time-interleaved operations.

In further aspect, any one of the time interleaving, communication between the phase detector and the loop filter, and the loop filter is implemented with software.

In further aspect, the apparatus includes an embedded channel in the clock synchronization channel configured to communicate the phase detector outputs between the first and second RF paths.

In further aspect, the apparatus includes a network of clock synchronization ports configured to align a plurality of LO clocks in a plurality of RF paths through distributed phase detection.

In further aspect, the network of clock synchronization ports is constructed using any one or more of daisy chain, ring, hypercube, star, or fully-connected topologies.

In a second aspect, the present disclosure provides a method for aligning a first local oscillator (LO) clock generated by a controllable LO clock generator in a first radio frequency (RF) path with a second LO clock in a second RF path. The method includes exchanging a synchronization clock between the first and second RF paths over a synchronization channel, measuring a phase alignment between the first and second LO clocks with a phase detector, and driving, with a loop filter, the controllable LO clock generator using the phase alignment.

In further aspect, the first and second RF paths comprise a low-bandwidth phase locked loop. The method includes manipulating a phase of the low-bandwidth phase locked loop to align the first and second LO clocks.

In further aspect, the method includes passing a first full rate clock from the first RF path to the second RF path over a first printed circuit board (PCB) trace or connector, passing a second full rate clock from the second RF path to the first RF path over a second PCB trace or connector, and measuring a relative phase of the first and second full rate clocks.

In further aspect, the method includes passing a first low rate clock from the first RF path to the second RF path over a first PCB trace or connector, passing a second low rate clock from the second RF path to the first RF path over a second PCB trace or connector, and measuring a relative phase of the first and second low rate clocks.

In further aspect, the first and second low rate clocks are synchronously generated and aligned to first and second full rate clocks.

In further aspect, the method includes passing, in a time interleaved manner, first and second full rate clocks of the first and second RF paths between the first and second RF paths over a PCB trace or connector and measuring a relative phase of the first and second full rate clocks.

In further aspect, the method includes passing, in a time interleaved manner, first and second low rate clocks of the first and second RF paths between the first and second RF paths over a PCB trace or connector and measuring a relative phase of the first and second low rate clocks.

In further aspect, the first and second low rate clocks are synchronously generated and aligned to first and second full rate clocks.

In further aspect, the method includes determining an output of the phase detector from three time-interleaved measurements and cancelling, with at least one replica receive buffer, systematic and environmental variability due to receive and transmit buffers.

In further aspect, the first and second RF paths each include a phase detector. The method further includes subtracting the output from each phase detector at the input of the loop filter, determining a true phase relationship between the LO clocks, and cancelling systematic and environmental variability due to transmit buffers.

In further aspect, the method for aligning the first and second local oscillator clocks includes separate time-interleaved operations.

In further aspect, any one of the time interleaving, communication between the phase detector and the loop filter, and the loop filter is implemented with software.

In further aspect, the method includes implementing communication of the phase detector outputs between the first and second RF paths by embedding a channel in the clock synchronization channel.

In further aspect, the method includes aligning a plurality of LO clocks in a plurality of separate RF paths through distributed phase detection over a network of clock synchronization ports.

In further aspect, the network of clock synchronization ports is constructed using any one or more of daisy chain, ring, hypercube, star, or fully-connected topologies.

In third aspect, the present disclosure provides a time to digital converter. The time to digital converter includes a D flip-flop for sampling first and second input clocks with a third clock and a counter configured to synchronously increment the resulting samples and create a digital proportional value representing the delay between the first two and second clocks.

In further aspect, the time to digital converter includes a set-reset latch for receiving the two input clocks. The two input clocks are trigger and target clocks as edge-triggered set and reset inputs to the set-reset latch. The set-reset latch output is sampled with the third clock.

In further aspect, the time to digital converter includes a decoder to detect sampled inputs where the first clock leads the second clock.

In further aspect, a frequency of the third clock is selected to ensure that clock edges of the third clock process through a period of the first two clocks, such that phase detector resolution is optimized.

In further aspect, a number of cycles to count the sampled clocks is selected such that phase detector resolution is optimized.

In further aspect, a phase discontinuity of the time to digital converter is detected to determine a lock point and prevent a false lock.

In fourth aspect, the present disclosure provides a method of time to digital conversion. The method of time to digital conversion includes sampling first and second input clocks with a third clock, using the resulting samples to synchronously increment a counter, and creating a digital proportional value representing the delay between the first and second clocks.

In further aspect, the method includes using trigger and target clocks as edge-triggered set and reset inputs to a set-reset latch and sampling the latch output with the third clock.

In further aspect, the method includes detecting sampled inputs with a decoder where the first clock leads the second clock.

In further aspect, the method includes determining a frequency of the third clock to ensure that clock edges of the third clock process through a period of the first two clocks, such that phase detector resolution is optimized.

In further aspect, the method includes determining a number of cycles to count the sampled clocks such that phase detector resolution is optimized.

In further aspect, the method includes detecting a phase discontinuity to determine a lock point and prevent a false lock.

Other aspects and features of the present disclosure will become apparent to those ordinarily skilled in the art upon review of the following description of specific embodiments in conjunction with the accompanying figures.

For ease of reference, the figures of the present disclosure illustrate signals as single lines, which may imply single-ended signaling techniques over single wire traces. However, as may be well known to those familiar with the art, signals may be implemented using differential signaling over two wire traces. For clarity, elements of the Figures that are common are identified using similar numbers.

Before considering further details of embodiments of the present disclosure, it is worthwhile to review aspects of some known approaches in relation to FIGS. 1-6.

FIG. 1 illustrates a conventional single local oscillator multiple antenna system 100. The single local oscillator system 100 includes a central clock 101 which provides a clock signal for multiple (N) antennas 103. The central clock 101 is fanned out to multiple RF paths 102 and multiple antennas 103. In each path 102, the central clock 101 is input into a parallel clock buffer 111, passing through printed circuit board (PCB) traces 112 with associated delays, passing through a RF transmit/receive block 115, and from there passing through a PCB trace 116 to the antenna 103.

In a variant, an N-path multiple-output transmit-only or receive-only RF system is constructed similarly, substituting a transmit-only or receive-only RF block in place of the transmit/receive block 115.

The single local oscillator system 100 of FIG. 1 may be costly and complex to produce, making the single local oscillator system 100 impractical. In the single local oscillator system 100, the power required to generate and distribute the central LO clock can be quite large as the clock frequency is relatively high. For example, Evolved Universal Mobile Telecommunications System Terrestrial Radio Access Network (EUTRAN) Operating Band VII specifies an uplink band of 2500-2570 MHz (2.50-2.57 GHz) and a downlink band of 2620-2690 MHz (2.62-2.69 GHz), both of which use LO frequencies of approximately 2.5 GHz.

The RF blocks 115 may have a higher-frequency clock, such as 2×LO or, in the case of EUTRAN Operating Band VII, 5.0 GHz. Distributing a 2.5 GHz (or 5.0 GHz) clock signal across a large system from the central generator may involve PCB traces having distances of 10 cm to over 1 meter and in some cases, the PCB traces include connectors. This increased distance may result in an expensive system and create several problems. At these frequencies and at these distances, signal integrity issues, reflections, and trace matching are critical, and preclude a single massive buffer that fans out the clock to all RF blocks, requiring multiple individual buffers, and sometimes multiple independent buffers in series. In turn, these multiple buffers may consume power, contribute to mismatch between delays, and result in phase differences between the destination points that need to be either calibrated or minimized by using even larger and higher-power buffers.

Having a plurality (N) paths spread out across a large PCB or across a backplane that is over a meter long may require a system designer to match trace lengths and equalize propagation delay between the N destinations. Consider using a rough heuristic that a speed of a signal in a matched PCB microstrip transmission line is approximately half the speed of light, or approximately $150 \times 10^6$ meters/second; in such a case, the time of flight between the central LO generator and an RF block that is 1 meter away is approximately 6.7 ns, or approximately 16.7 periods of a 2.5 GHz LO clock. As a result, without matching trace lengths, the phase of the clock when it arrives at the RF blocks is essentially random and arbitrary. If the system designer chooses to create N separate 1 meter traces to compensate for this, trace matching may be considered. If the traces are matched to within 1%, they are matched to within 0.167 periods of that same 2.5 GHz LO clock, which is another way of saying that the phase of the clocks at the RF blocks have as much as 60 degrees of mismatch. Compensating for this may require in-depth calibration or extremely expensive PCB materials and perhaps multiple PCB spins to reduce the resulting mismatch to an acceptable level.

Production variation of the buffers and clock distribution channel (both PCB traces and connectors), as well as variation of these components due to changes in environmental conditions such as temperature, voltage, and humidity, may create additional challenges to the system designer, and potentially adds to the cost and complexity of the necessary calibration.

Figure 2:
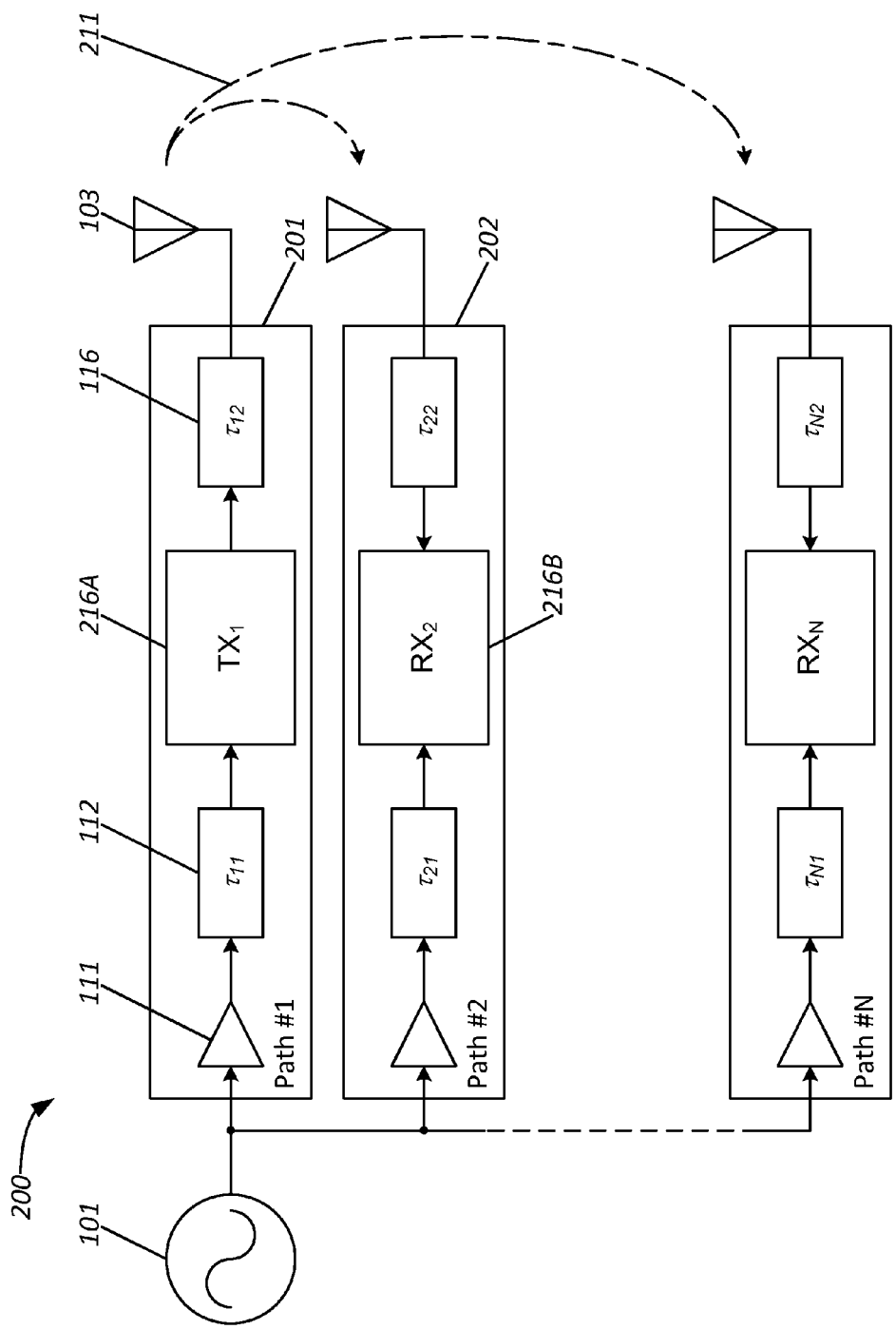
FIG. 2 is a single local oscillator system with over-the-air radio frequency calibration.

FIG. 2 illustrates a single-LO multiple antenna system 200 that uses an over-the-air RF calibration. In FIG. 2, a central common LO generator 101 feeds an RF transmit path 201 and N separate RF receive paths 202. The RF block in path 201 has been configured for transmit only 216A while the remaining RF blocks in paths 202 have been configured for receive only 216B. The path 201 with the transmit-only block 216A may provide a calibration signal to the multiple paths 202 with the receive-only block 216B wirelessly as an "over-the-air" signal between antennas 211.

A precise one-time measurement of the phase relationships is performed at the antennas 103. Delays contributed to the system 200 of all the components between the LO 101 and the antennas 103 are determined. More precise measurements may be made by successively configuring each of the N RF receive paths 202 as a transmit only path 201 and measuring the over-the-air delays at each of the other paths 202, similar to what is described in U.S. Pat. No. 8,204,143 B2 to Ravid et al.

The one-time calibration may be precise but may need careful engineering of the LO clock distribution. The calibration may allow the single-LO multiple antenna system 200 to compensate for systematic variation between the multiple paths 201, 202. The single-LO multiple antenna system 200 may still be sensitive to environmental variability. For example, a systematic delay between the two paths 201, 202 in the PCB traces and connectors of 16.7 LO clock periods may be compensated for by introducing a delay into the modulating signal of the shorter trace, but if the longer trace delay varies by 1%, with environmental changes, the effective phase accuracy remains 0.167 clock periods, or 60 degrees. Environmental variability of the buffers 111, the RF blocks 216A, 216B, and the traces 116 to the antennas 103 also add to the complexity. Given the relative magnitude of typical delays, the LO clock distribution traces 116 tend to have a large contribution from environmental variability. The clock distribution for the single-LO multiple antenna system 200 which includes RF calibration may be only slightly less complex (and costly) than the single local oscillator system 100. In addition, if the expected environmental variability components of the delay are large enough, it may not be sufficient to do production or initial power-up calibration, and it may be necessary to do some form of background calibration, which may impact the overall system architecture.

Figure 3:
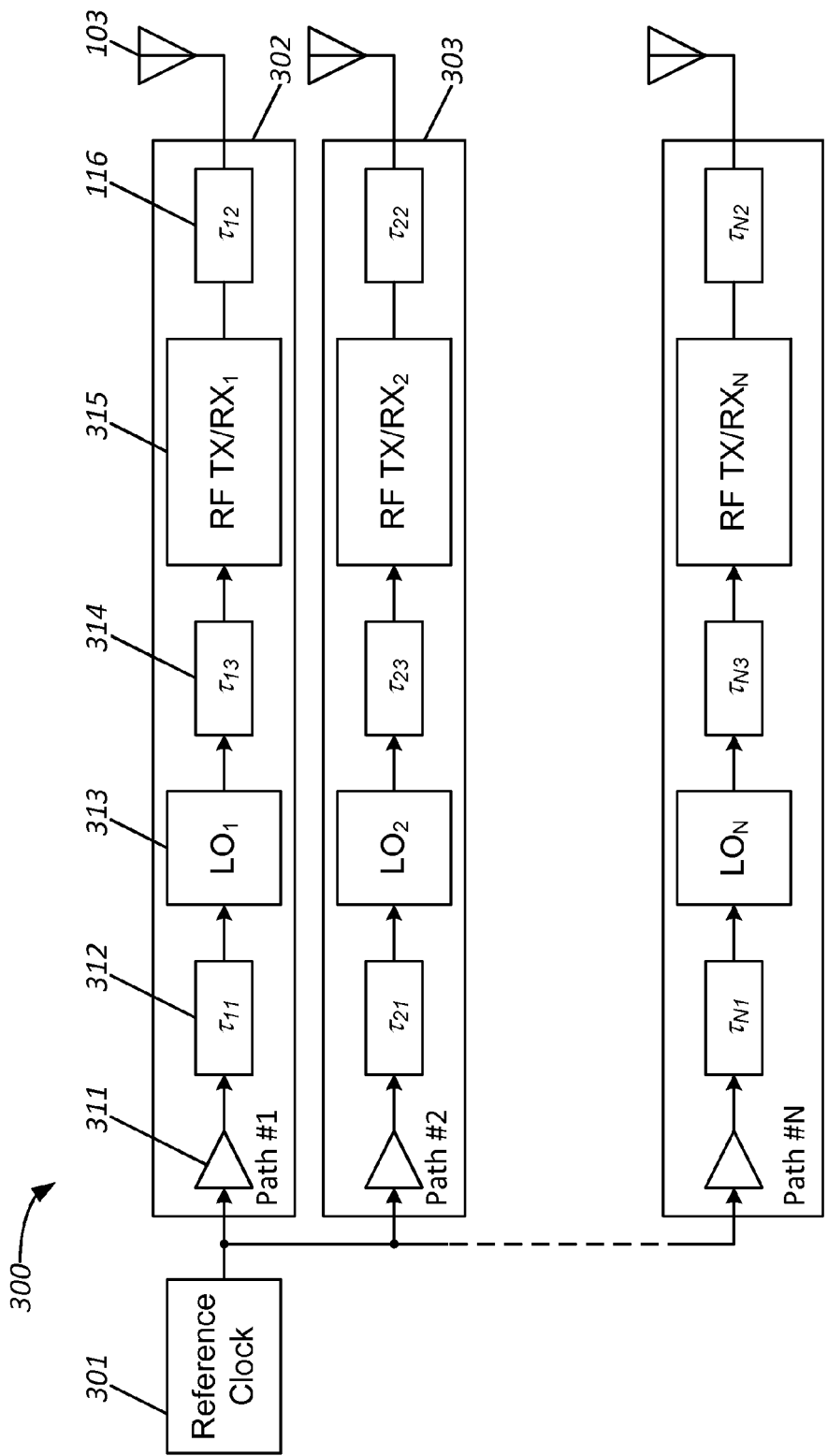
FIG. 3 is a multiple local oscillator multiple antenna system

FIG. 3 illustrates a multiple-LO multiple-antenna system 300. The multiple-LO multiple-antenna system 300 replaces the central LO generator 101 of FIGS. 1 and 2 with a plurality (N) of independent LO generators 313, one in each path 302, 303. There may not be a difference between the configurations of each of paths 302, 303. In the multiple-LO multiple-antenna system 300, instead of distributing a full-rate LO clock, a lower-speed reference clock generator 301 provides a frequency reference to the N local LO generators 313 through a set of buffers 311, PCB traces 312, and connectors. RF blocks 315 in the multiple-LO multiple-antenna system 300 are similar to the RF blocks 115, 216A, 216B of FIGS. 1 and 2. The PCB trace 116 and the antenna 103 in the multiple-LO multiple-antenna system 300 are similar to those of FIGS. 1 and 2.

The multiple-LO multiple-antenna system 300 may have a lower power for clock distribution. A reference clock frequency may be lower than the required LO frequency. For example, the reference clock frequency may be in the range of 100-250 MHz (or lower) compared to 2.5 GHz or higher, which requires significantly less power to distribute. The additional power required for the local LO generators may not be an issue, as the local LO generator is often already present, even in the single local oscillator system 100. The multiple-LO multiple-antenna system 300 may be built in a modular fashion, with interchangeable RF cards 315 plugged into a common backplane as opposed to the single-LO multiple antenna system 200 built with a central LO clock generator 101.

This reduction in power and improved flexibility sacrifices phase alignment between the multiple antennas 103. The LO generators 313 may be implemented as fractional-N phase locked loops (PLLs) as compared to an integer-N PLL. On initial power-up, the output phase relationships are not guaranteed as each PLL may, in practice, take a different time to reach phase lock. The time to reach phase lock may be a further source of phase uncertainty to be compensated for. In addition, lower power buffers used in reference clock distribution may be slower than the equivalent buffers used for central LO clock distribution, and as a result may be more sensitive to environmental changes.

The phase differences of the LO clocks 313 at the different antennas 103 in the multiple-LO system 300 come from three sources: systematic differences arising from system design and production variability, differences arising from different components' differing reactions to environmental changes, and power-on differences arising from initial transient effects of the local LO generators. The first two are similar to (but possibly larger than) those observed in single-LO systems 100, 200, while the third is specific to the multiple-LO system 300.

As a result, it may be desirable to align the phases of multiple LOs across the multiple-LO system 300. It may be desirable that the multiple-LO system 300 is readily adapted to operation with backplanes over a meter long and multiple connectors and does not add significant cost to the system. Such a system does not account for delay mismatch in components between the LO generators 313 and the antennas 103. The multiple-LO system 300 does not totally remove the requirement for additional calibration such as over-the-air calibration described with reference to FIG. 2. The multiple-LO system 300 may reduce the amount of delay mismatch that this additional calibration must detect and correct for, and therefore potentially reduce the complexity and cost of this calibration.

Phase-Locked Loops (PLLs) are key components in almost any system that deals with digital clock signals. The theory behind PLLs and their use in different applications is well known to those skilled in the art.

Figure 4:
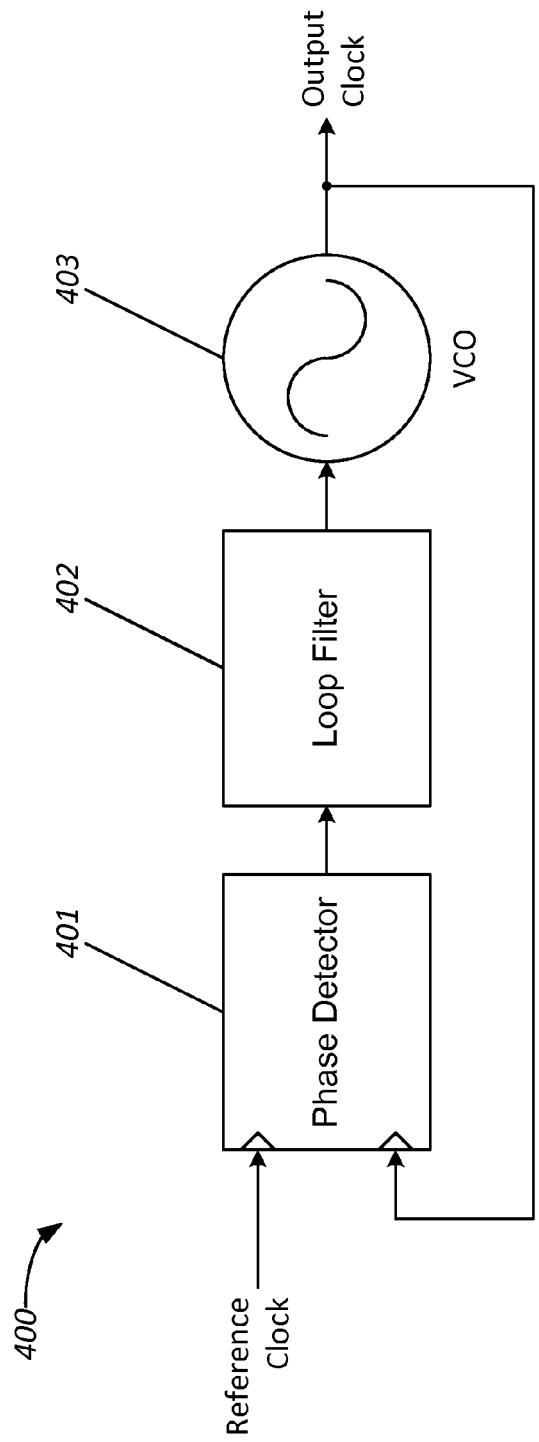
FIG. 4 is an elementary phase-locked loop.

FIG. 4 illustrates an elementary phase-locked loop 400. The elementary PLL 400 consists of three elements: a phase detector 401, a loop filter 402, and a voltage controlled oscillator (VCO) 403. The phase detector 401 compares its two clock inputs, a reference clock and an output clock, and produces an output that is representative of the phase difference between the edges of the two clocks. This output is then filtered by the loop filter 402, and thereby controls the frequency of the VCO 403. The output from the VCO 403 is then fed back, closing the loop, into the phase detector 401. As is known to those skilled in the art, there are many ways of constructing the sub-components of the PLL 400.

Once the elementary PLL 400 has locked and reached a steady-state operating mode, the frequency of the output clock is the same as the reference clock, and the time difference (or equivalently, the phase difference) between the two inputs at the phase detector 401 inputs will be known. In certain elementary PLLs 400, the time difference is ideally zero. Depending upon the application in relation to which that the elementary PLL 400 is being used, and on the construction of the sub-components 401, 402, 403, there may be a non-zero difference, also known as a static phase offset. In the elementary PLL 400, a lock is achieved when the phase difference at the phase detector 401 reaches the desired static value.

Figure 5:
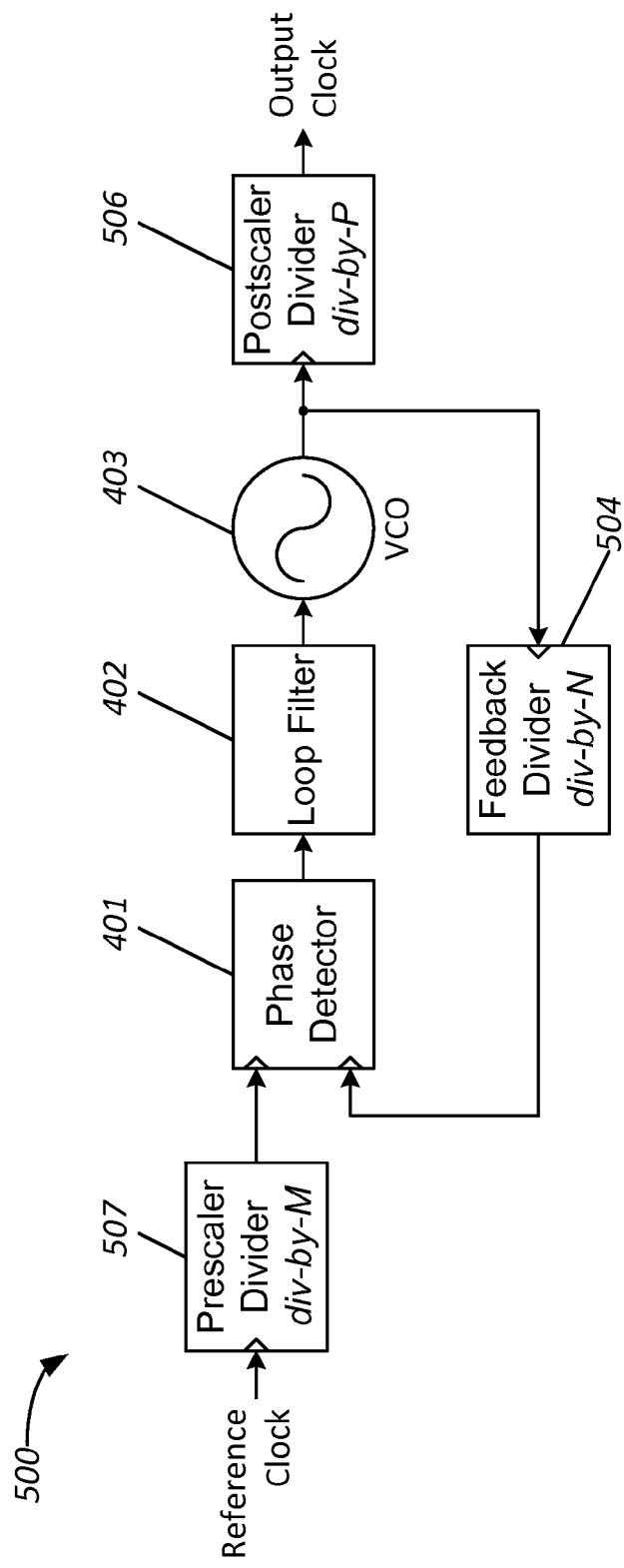
FIG. 5 is an integer-N phase-locked loop.

FIG. 5 illustrates an integer-N clock generator PLL 500. The elementary PLL 400 is extended to produce the integer-N clock generator PLL 500 by the addition of several digital dividers: a feedback divider 504 (divide by N), a postscaler divider 506 (divide by P), and a prescaler divider 507 (divide by M).

By forcing a known phase alignment (and therefore locking the frequency) between the two inputs of the phase detector 401, the integer-N clock generator PLL 500 generates an output clock frequency (F_out) that is related to a reference clock frequency (F_ref) according to the following equation: F_out=F_ref/M·N/P.

The output clock frequency is a rational multiple of the reference clock frequency, with the ratios being simple integers. In many applications, including RF LO generation, being able to produce fine frequency steps in the output is desirable. In order to produce fine frequency spacing (for example, cellular telephone RF systems often desire 100 kHz LO spacing), a system will require either a relatively low frequency reference clock (F_ref) or a relatively high prescaler divider (M) so that the clock frequency at the phase detector 401 input, given by F_ref/M is equal to the desired spacing. However, for a number of performance-related reasons well known to those skilled in the art, it is highly disadvantageous to have a low phase detector input frequency.

Figure 6:
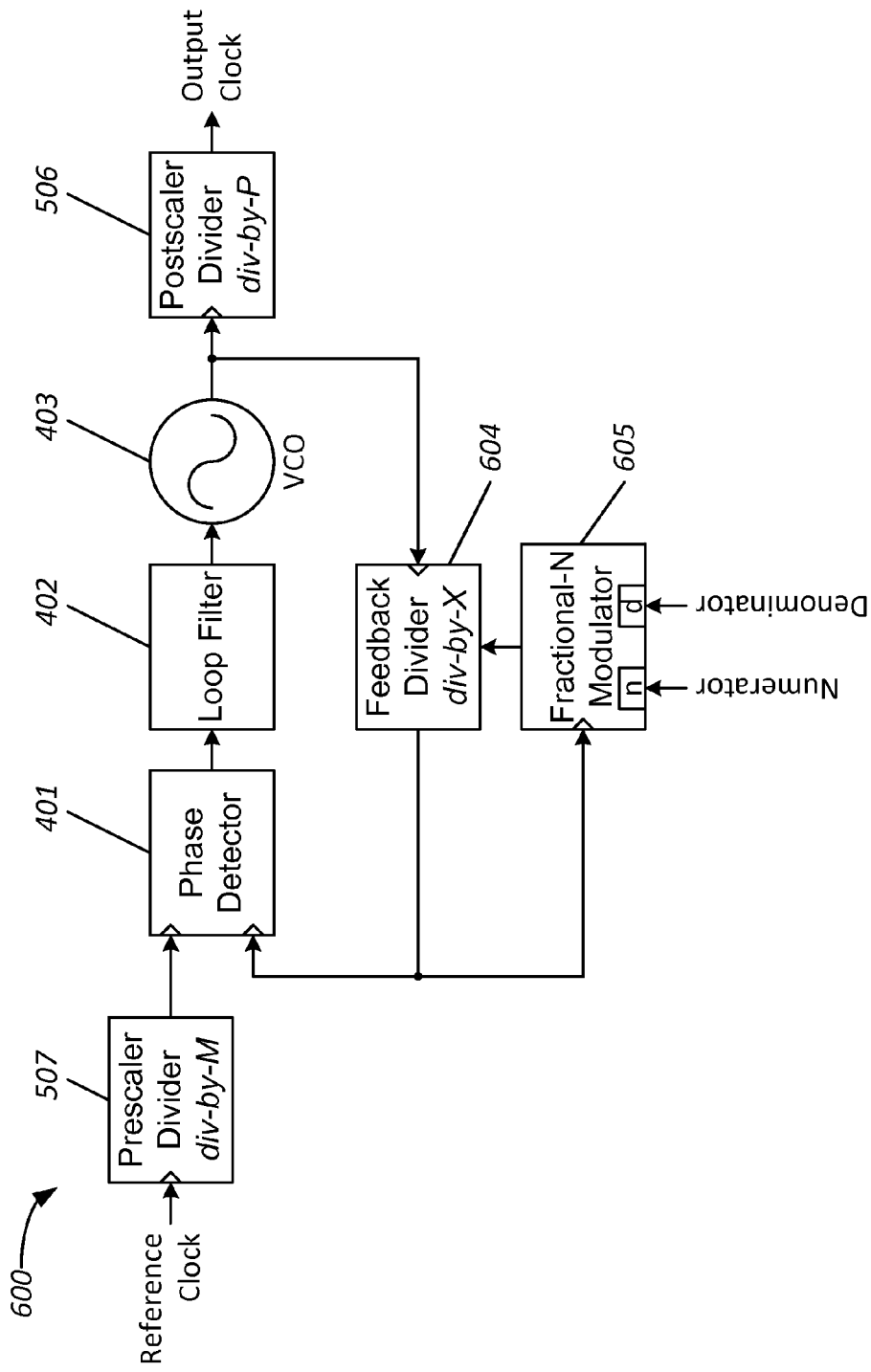
FIG. 6 is a fractional-N phase-locked loop.

FIG. 6 illustrates a fractional-N clock generator PLL 600. In a RF LO clock generator may be implemented with the fractional-N clock generator PLL 600. In the fractional-N clock generator PLL 600, the fixed feedback divider 504 of FIG. 5 is replaced with a combination of a programmable feedback divider 604 and a fractional-N modulator 605. By introducing the programmable feedback divider 604 and the fractional-N modulator 605, the effective feedback divide ratio, which was originally an integer divide-by-N becomes a divide-by-$\overline{X}$, where $\overline{X}$ is the average value of X over time and $\overline{X}$=n/d, where n and d are the numerator and denominator, respectively, of a rational fraction and are inputs to the fractional-N modulator 605. The fractional-N modulator 605 may be implemented using a delta-sigma modulator (DSM). The output frequency (F_out) of the fractional-N clock generator PLL 600 is given by: F_out=F_ref/M·$\overline{X}$/P=F_ref/M·n/(d·P).

The phase detector 401 input frequency F_ref/M may be raised to no longer be the required frequency spacing, which is advantageous for PLL performance, while at the same time achieving fine frequency resolution by using large integer values for both n and d. In certain practical fractional-N clock generator PLLs 600, the integer values (n, d) are large (e.g., perhaps 40 bits or more) to give ultra-fine frequency resolution.

Comparing the integer-N PLL clock generator PLL 500 to the fractional-N PLL clock generator 600, replacing the fixed divider 504 with a programmable divider 605 and a fractional-N modulator 605 increases the design complexity. However, in modern deep submicron complementary metal-oxide-semiconductor (CMOS) processes, the additional design complexity may have minimal power or area impact, and the performance improvements outweigh the costs associated with additional complexity. The integer-N PLL 500 and fractional-N PLL 600 may also have slightly different loop filter designs; however, in well-designed systems, this difference is usually insignificant.

A property of the fractional-N PLL 600 is that, by modulating the inputs to the fractional-N modulator 605 over time, it is possible to manipulate the phase of the output clock directly while keeping the phase detector 401 inputs locked. For example, if the numerator (n) is momentarily decreased by 1 for one divide cycle, the phase of the VCO 403 output will slip by 1/d of a clock period. Similarly, if n is momentarily increased by 1 for one divide cycle, the phase of the VCO 403 output will advance by 1/d of a clock period. This property holds even if the ratio n/d is normally an integer, and can be looked at as the ability to introduce an arbitrary delay (or phase) offset at the input of the phase detector 401. This property of the fractional-N PLL 600 is used in other areas, particularly in telecommunication and data communication networks for end-to-end transport timing and jitter attenuation applications as described in U.S. Pat. No. 7,986,190 to Lye.

This same function may also be accomplished with the integer-N PLL 500 where one or more of the dividers 504, 506, 507 are manipulated on a cycle-by-cycle basis, however most desirable applications would require either prohibitively low phase detector 401 input frequencies F_ref/M or prohibitively high VCO 403 frequencies, making such systems impractical for many applications.

Figure 7:
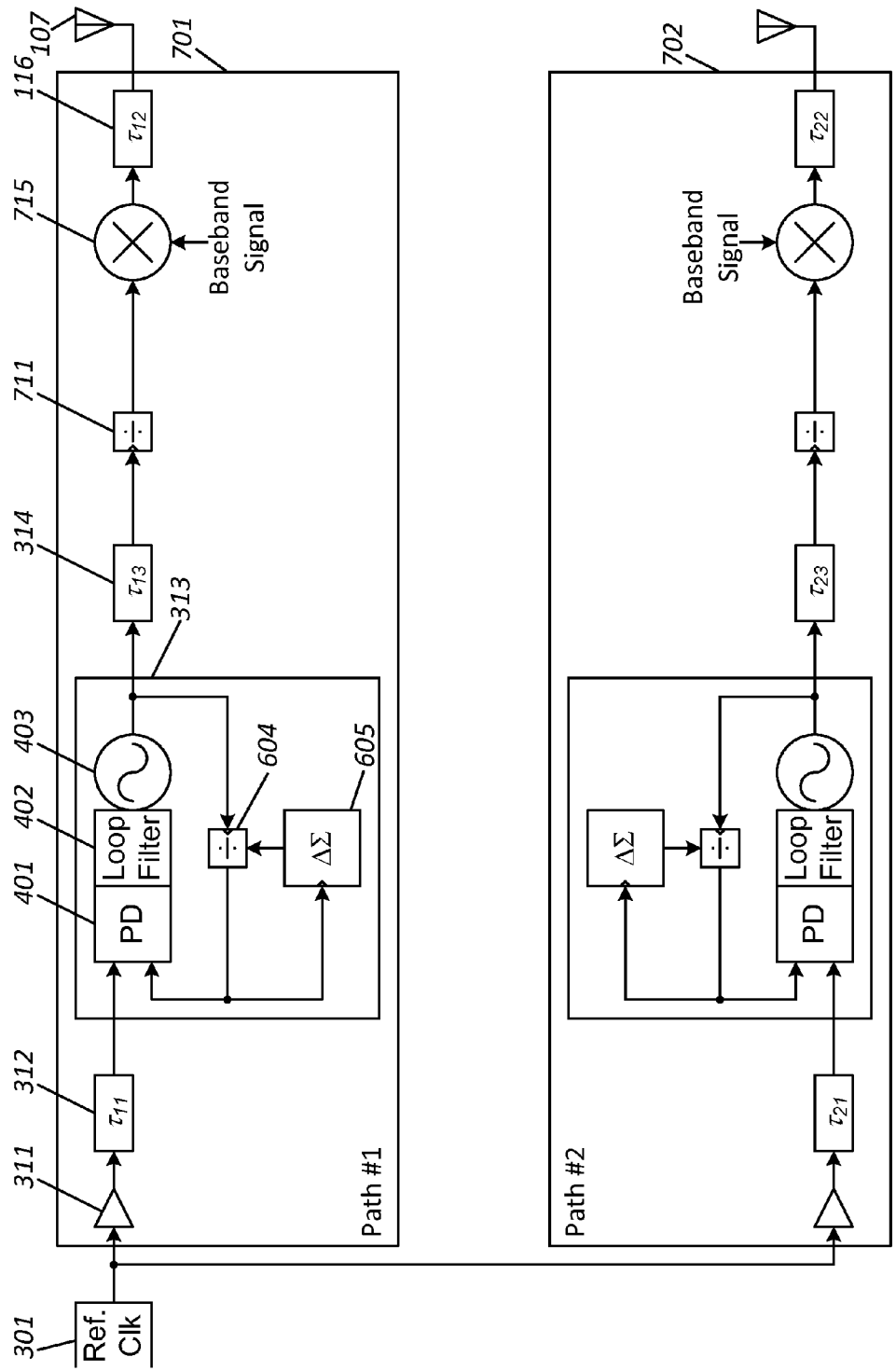
FIG. 7 is an unaligned two antenna two local oscillator radio frequency system, in accordance with an embodiment.

FIG. 7 illustrates an unaligned 2-antenna 2-LO RF system 700 to be synchronized, in accordance with an embodiment. The unaligned 2-antenna 2-LO RF system 700 has a first path 701 and a second path 702. Comparing the system 700 with the systems of FIGS. 1, 3, and 6, the local LO clock generator 313 is drawn as a separate fractional-N PLL as in FIG. 6 but without a prescaler divider 507 or a postscaler divider 506. The transmit RF block 115, 315 is drawn as a local clock divider 711 and mixer 715 that are used to modulate a baseband signal for transmission over the antenna 107.

For simplicity, FIG. 7 and the remainder of the disclosure focus on transmit-only systems. However, systems according to other embodiments incorporate RF receivers.

Where the relative phase of the local LO clock generators 313 of the two paths 701, 702 is measured, modulating the control inputs (numerator (n) and/or denominator (d)) of one or both of the fractional-N modulators 605 brings the two LO clock generators 313 into alignment, taking advantage of the ability of the fractional-N modulator 605 to introduce an arbitrary phase offset at the input of the phase detector 401.

Figure 8:
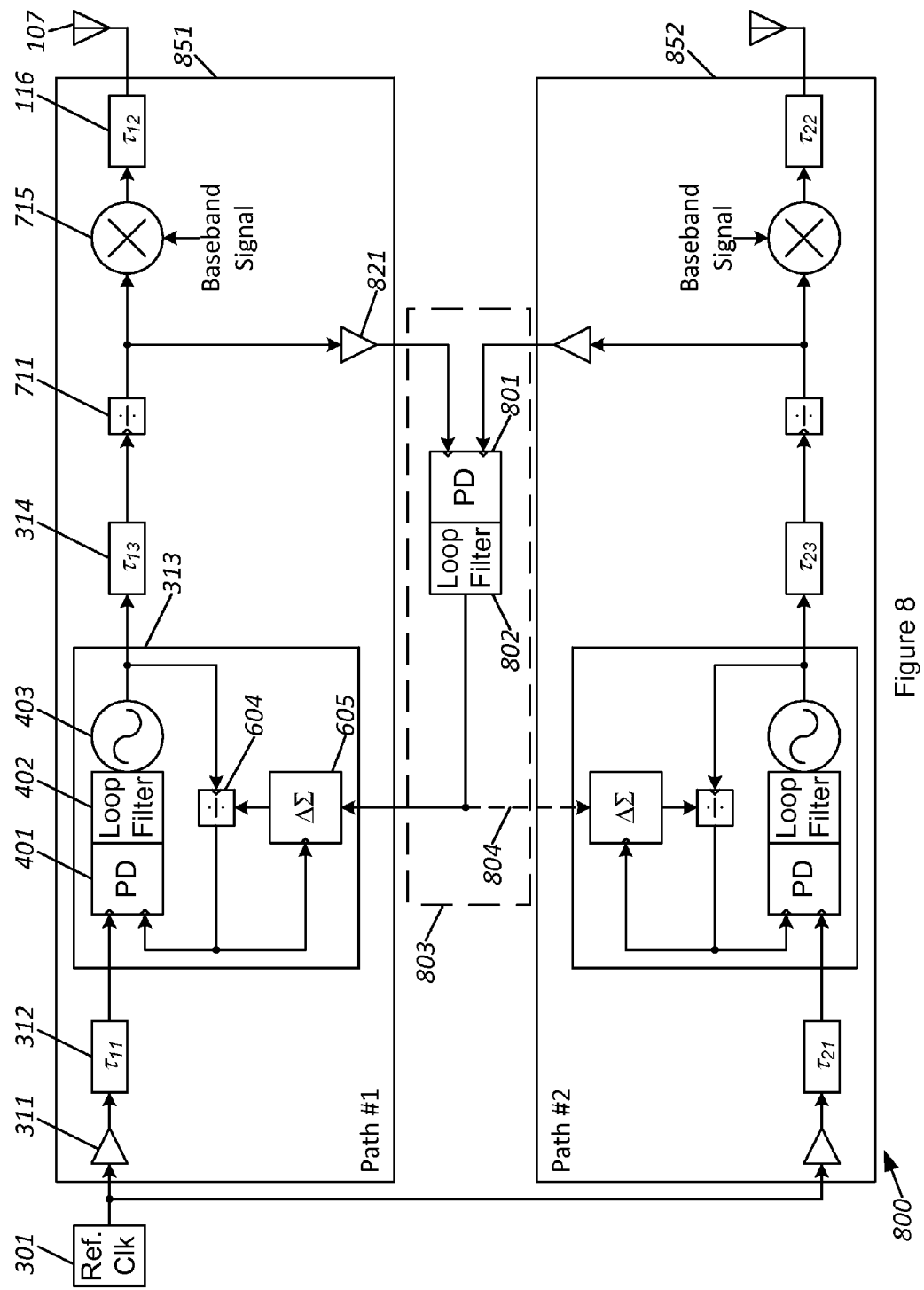
FIG. 8 is a two antenna local oscillator radio frequency system with central phase detection, in accordance with an embodiment.

FIG. 8 illustrates a 2-antenna 2-LO RF system 800 with central phase detection, in accordance with an embodiment. To align the two independent LO clock generators 313 of the two RF paths 851, 852 a low-frequency PLL 803 is added. The low frequency PLL 803 modulates one of the fractional-N modulators 605 in the two generators 313. The low-frequency PLL 803 has a phase detector 801. The phase detector 801 observes the clock phases at the input to the two RF mixers 715, compares the phases, and forces the phase differences to a known value (e.g., zero) through an additional loop filter 802.

The additional loop filter 802 drives the LO clock generator 313 of the first path 851 such that the RF mixer 715 inputs of the first path 851 are aligned to the RF mixer 715 inputs of the second path 852. In an embodiment, the loop filter 802 aligns the second path 852 with the first path 851, or drives both paths 851, 852 together simultaneously (reflected by the additional dashed signal line 804 from the loop filter 802 output into the LO generator 313 of the second path 852). The synchronization signal between the paths 851, 852 and the phase detector 801 is a synchronization clock, and is direct current (DC) balanced, allowing easy connection through alternating current (AC) coupled traces.

The 2-antenna 2-LO RF system 800 also distributes the LO clock 715 inputs from both paths 851, 852 to the low frequency PLL 803 through additional buffers 821. As with distributing the full-rate LO clocks described with reference to FIG. 1, this distribution may have the trace propagation delays matched, using additional power for distributing the clocks.

The 2-antenna 2-LO RF system 800 is constructed with two nested PLLs. The inner loop, the fractional-N PLL 313, acts as the VCO in the low frequency PLL 803, the outer loop, to align the LO clocks. The inner loop's bandwidth is higher (e.g., several orders of magnitude higher) than the outer loop's bandwidth to prevent instability. In a practical RF system, this loop bandwidth difference may be preferable, because any action of the outer loop appears as wander on the LO clocks, which in turn appears as low-frequency phase noise on the RF paths 851, 852. Once the system 800 is locked and the LOs are aligned, the outer loop will act over time to keep the LOs locked as environmental conditions change, such that outer loop bandwidth does not need to be very high (e.g., 1 Hz or lower). In an embodiment, the loop filter 802 may be implemented in software. The control inputs to the fractional-N modulator 605 may be also implemented in software.

Figure 9:
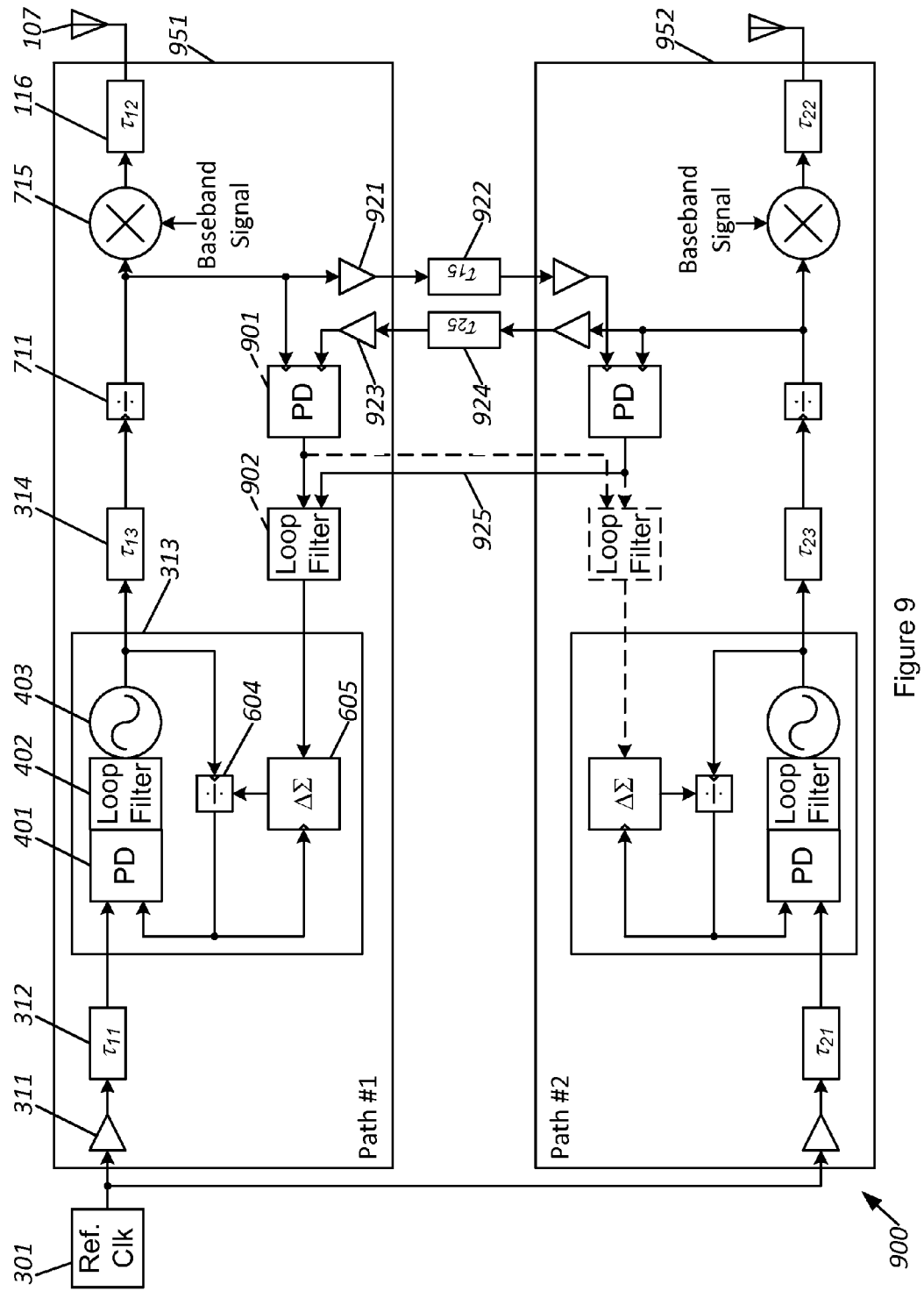
FIG. 9 is a two antenna two local oscillator system with distributed phase detection, in accordance with an embodiment.

FIG. 9 illustrates a 2-antenna 2-LO RF system 900 with distributed phase detection, in accordance with an embodiment. The 2-antenna 2-LO RF system 900 distributes the components of the low frequency PLL 803 (of FIG. 8) within each path 901, 902. The 2-antenna 2-LO RF system 900 includes, in each path 951, 952, a phase detector 901 and optionally a loop filter 902 for driving the local fractional-N modulator 605.

The 2-antenna 2-LO RF system 900 includes a transmit buffer 921 and a receive buffer 923 on first and second point-to-point PCB traces 922, 924. The transmit buffer 921 and the receive buffer 923 distribute the LO clocks from the RF mixers 715 between the two paths 951, 952. The two point-to-point PCB traces 922, 924 are matched to one another. Matching the two traces 922, 924 between the two paths 951, 952 may be simpler than matching traces between the two paths 851, 852 and the low frequency PLL 803 as described with reference to FIG. 8. The synchronization clocks passed along the traces 922, 924 are DC balanced clocks, allowing ready AC coupling.

Unlike in the system of FIG. 8, the LO clock generators 313 are not aligned to one another when the phase detector 901 inputs are zero. Instead, the phase detectors 901 produce an output that is equal to the sum of the delay through the buffers 921, 923 and through the PCB traces 922, 924 between the two paths 951, 952. The LO clock generators 313 are aligned when the two phase detectors 901 measure the same delay.

In an embodiment, the phase detector 901 is more than a simple two-state phase comparison circuit as is often used in extremely high frequency systems. The phase detector 901 is selected such that it produces an output that is proportional to the phase difference at its input and has a resolution that is sufficiently fine enough to meet the desired phase alignment requirements.

The loop filter 902 has two inputs, one from a local phase detector 901 in the same path 951 and the other from a remote phase detector in a different path 952. The two inputs are passed over an offline synchronization channel 925 and the two inputs are subtracted from one another to determine the direction to drive the local LO clock generator 313. As with the 2-antenna 2-LO RF system 800, the 2-antenna 2-LO RF system 900 aligns the first path 951 with the second path 952, the second path 952 with the first path 951, or simultaneously drives both paths 951, 952 to a common alignment.

In an embodiment, the phase detector 901 is implemented using a time to digital converter (TDC) that converts the delay between two paths 951, 952 into a proportional digital value. In an embodiment, the outputs from the phase detector 901, the loop filter 902, and the fractional-N modulator 605 inputs are implemented in software. In a further embodiment, the synchronization channel 925 is implemented in a low-frequency multiplexed serial or parallel microprocessor peripheral bus shared with the rest of the blocks of the 2-antenna 2-LO RF system 900, minimizing the number of unique signals connected between the paths 951, 952.

The 2-antenna 2-LO RF system 900 exchanges full-rate LO synchronization clocks between the two paths, which requires a significant amount of power to drive the buffers (921 and 923).

Figure 10:
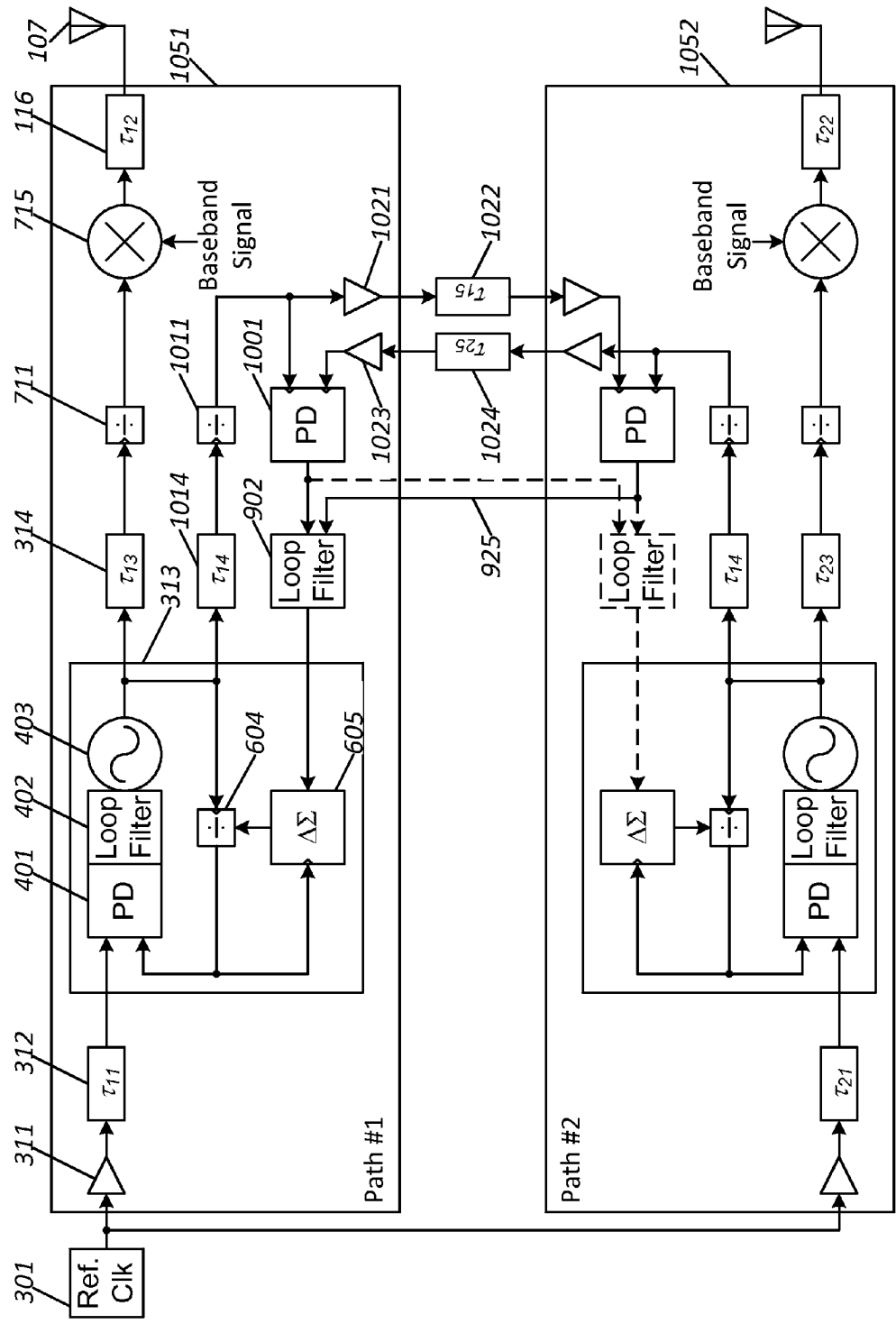
FIG. 10 is a two antenna two local oscillator system with reduced frequency distributed phase detection, in accordance with an embodiment.

FIG. 10 illustrates a 2-antenna 2-LO RF system 1000 with reduced-frequency distributed phase detection, in accordance with an embodiment. The 2-antenna 2-LO system 1000 includes a low-frequency clock divider 1011 and a signal trace delay 1014. The divider generates a lower-frequency synchronization clock in parallel with the LO clock used by the RF mixer 715. The construction of the low-frequency clock divider 1011 mirrors and matches the divider 711 before the RF mixer 715. Similarly, the signal trace delay 1014 associated with the low-frequency synchronization clock matches trace delays 314 associated with the RF mixer clock 715 input. The two dividers 711, 1011 in each path 1051, 1052 are synchronized to each other using techniques that are well known in the art.

The 2-antenna 2-LO RF system 1000 includes buffers 1021, 1023 and external PCB traces 1022, 1024. The power associated with buffers 1021, 1023 is significantly reduced as compared with the buffers 921, 923 described with reference to FIG. 9.

In the 2-antenna 2-LO RF system 1000, instead of distributing an RF LO-rate clock between the two paths 1051, 1052 (as described with reference to FIG. 9), a lower-frequency synchronization clock is exchanged between the two paths 1051, 1052.

In an embodiment, the LO clock generator 313, the RF mixer divider 711, the low-frequency clock divider 1011, and the traces 312, 314, 1014 are implemented together on the same integrated circuit, thereby minimizing the power required for constructing the 2-antenna 2-LO RF system 1000 and improving the matching between the dividers 711, 1011. In a further embodiment, the RF mixer 715, the low-speed clock buffers 1021, 1023, and the phase detector 1001 are further integrated in the 2-antenna 2-LO RF system 1000.

Figure 11:
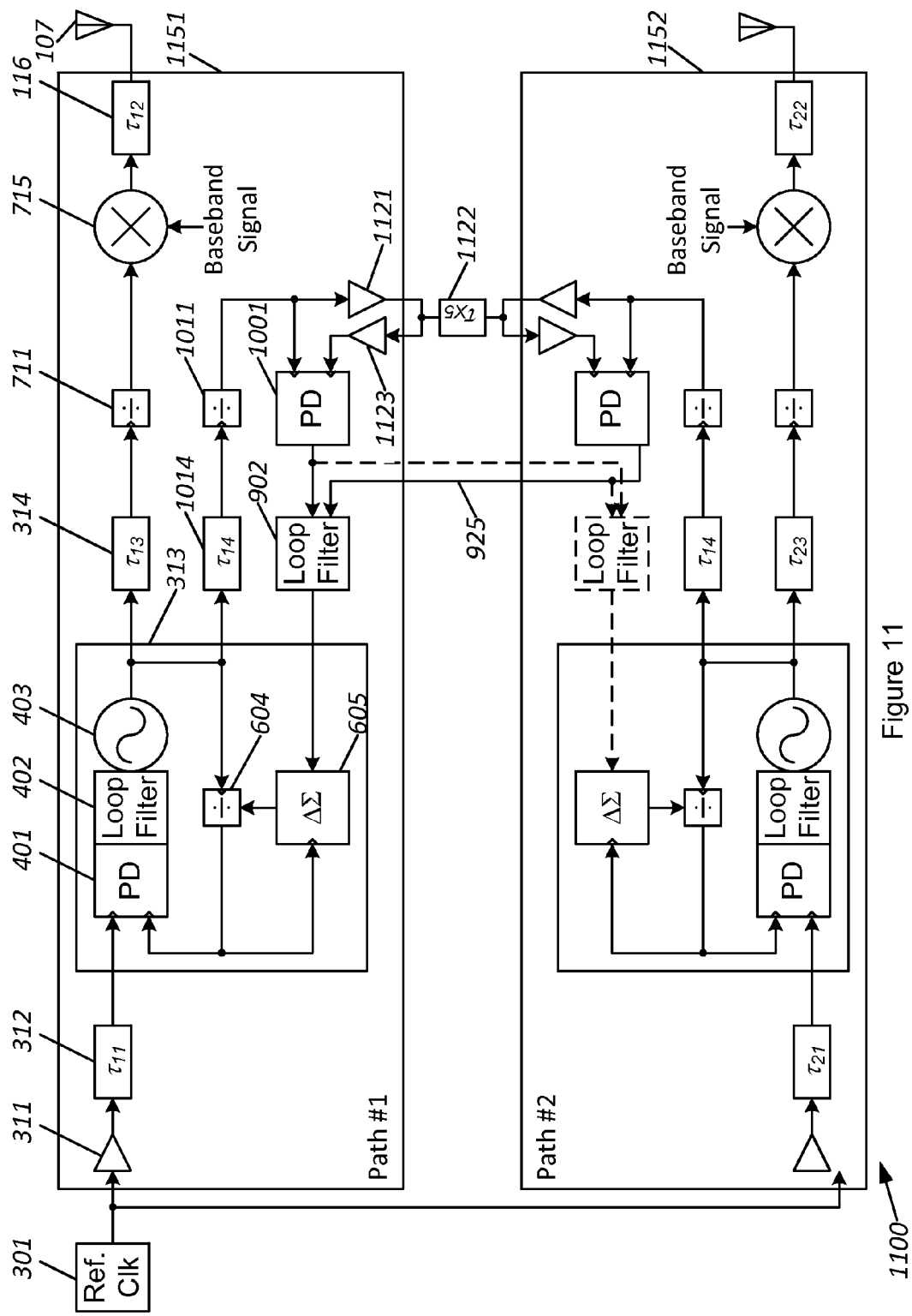
FIG. 11 is a two antenna two local oscillator radio frequency system with bidirectional reduced frequency distributed phase detection, in accordance with an embodiment.

FIG. 11 illustrates a 2-antenna 2-LO RF system 1100 with bi-directional reduced-frequency distributed phase detection, in accordance with an embodiment. In the 2-antenna 2-LO RF system 1100, the separate uni-directional low-rate external clock traces 1022, 1024 of FIG. 10 are replaced with a single bi-directional clock trace 1122, and buffers 1123, 1121 associated with the bi-directional clock trace 1122 are modified to allow bi-directional operation over the single trace 1122.

The 2-antenna 2-LO RF system 1100 removes the sensitivity to mismatch in the external PCB traces 1022, 1024 (as described with reference to FIG. 10), and further reduces the number of direct electrical connections between the paths 1151, 1152.

Unlike in FIG. 10, the 2-antenna 2-LO RF system 1100 does not simultaneously measure the low-speed clock phase alignment at both ends of the trace 1022, 1024. The 2-antenna 2-LO RF system 1100 includes higher-level phase detector 1001 to, at each end of the trace 1122 in sequence, measure the phase alignment and adjust the loop filter 902 appropriately.

In an embodiment, given the required loop bandwidths of the outer phase adjustment loop and a software implementation of the loop filter 902, the high-level synchronization is implemented using software.

The distributed phase detection 2-antenna 2-LO RF systems 900, 1000, 1100 may be sensitive to systematic and environmental variation of the buffers used for driving either the full-rate (900) or lower-rate (1000 and 1100) clocks between the paths. Depending upon the target phase alignment, this sensitivity may or may not be a significant source of error. The delay due to systematic and environmental mismatch of the buffers 1121, 1123 may remain once the system is otherwise aligned.

Figure 12:
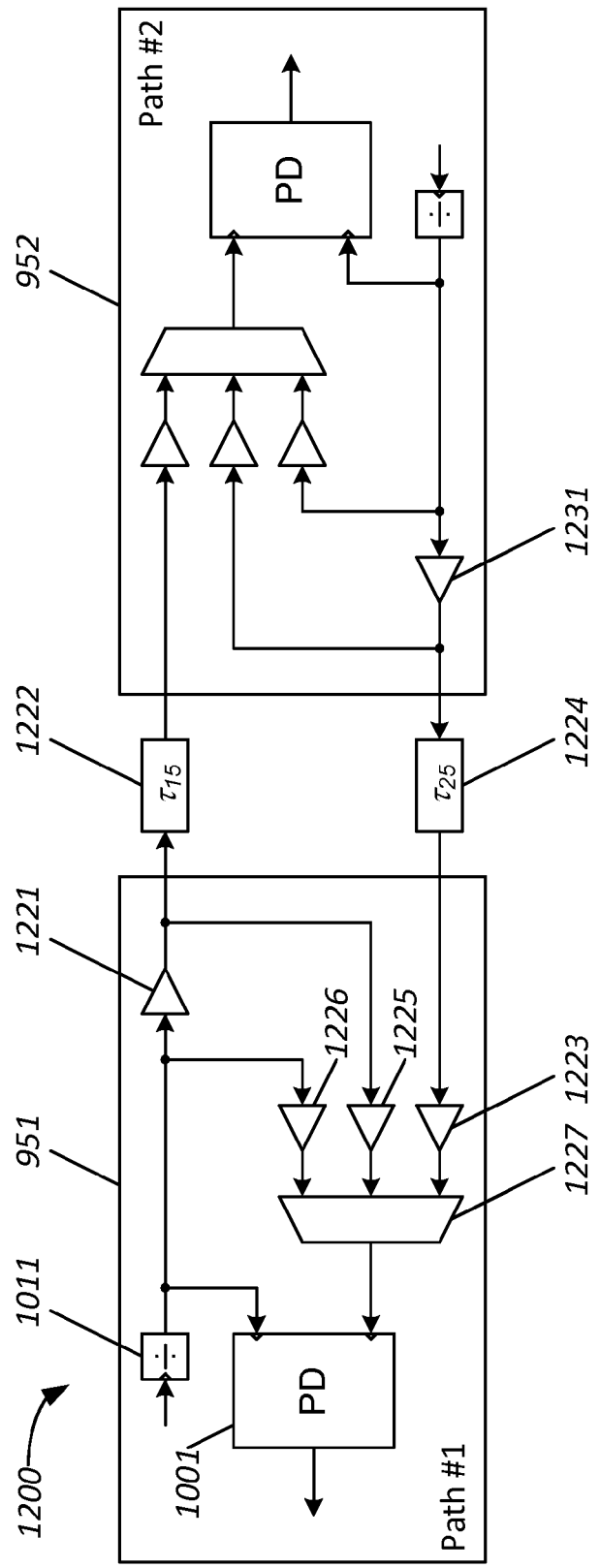
FIG. 12 is buffer compensation circuitry for unidirectional distributed phase detection, in accordance with an embodiment.

FIG. 12 illustrates a buffer compensation circuit 1200 for uni-directional distributed phase detection, in accordance with an embodiment. The buffer compensation circuit 1200 includes, buffers for transmitting 1221 and receiving 1223 the synchronization clocks, two replica receive buffers 1225, 1226, and a multiplexer 1227. The buffer compensation circuit 1200 may compensate for the variability in the divided-down LO synchronization clocks between paths.

In order to measure the phase difference between the two (optionally divided-down) LO clock sources of the two paths 951, 952 as seen at the first path 951, three delay difference measurements are taken. The first measurement, TPD1, measures the delay difference between far-end and near-end divided-down LO clock sources by measuring the delay between the output of the local divider 1011 and the far-end divider as seen through a far-end transmit buffer 1231, a uni-directional trace 1224, the near-end receive buffer 1223, and the multiplexer 1227. The second measurement, TPD2, measures the delay of the local transmit and receive buffers by looping the output from the local transmit buffer 1221 back through the first replica receive buffer 1225 and the multiplexer 1227. The third measurement, TPD3, measures the delay of the replica buffer by looping the input of the local transmit buffer 1221 back through the second replica buffer 1226 and the multiplexer 1227.

After all three measurements are taken, the final phase detector 1001 output is calculated as TPD0=TPD1+TPD2−2·TPD3, and represents the sum of the delays of both transmit buffers 1221, 1231 plus the delay of the trace 1224. So long as the three receive buffers 1223, 1225, 1226 are matched and vary the same way both systematically and environmentally (such as if all three are integrated together on the same integrated circuit) and so long as the two traces 1222, 1224 are also matched, subtracting the TPD0 values as calculated at the two phase detectors 1001 (and therefore cancelling out the transmit buffer delays) provides a direct measurement of the alignment of the LO clocks in the two paths 951, 952.

Figure 13:
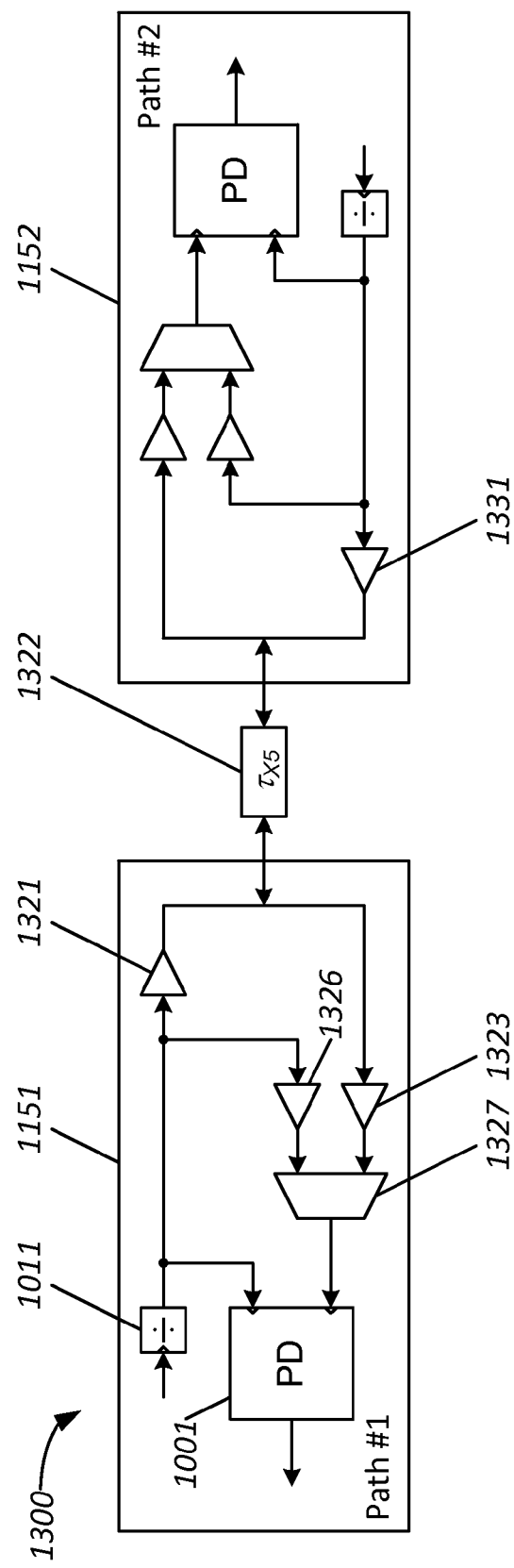
FIG. 13 is buffer compensation circuitry for bidirectional distributed phase detection, in accordance with an embodiment.

FIG. 13 illustrates a buffer compensation circuit 1300 for bi-directional distributed phase detection. The buffer compensation circuit 1300 has a transmit buffer 1321 which is modified to allow a far-end driver 1331 to drive the link at certain times. The buffer compensation circuit 1300 also has a one replica receive buffer 1326 and a simplified multiplexer 1327. The multiplexer 1327 has a two-input design instead of a three-input design. Where a bi-directional synchronization channel is used (as in FIG. 11), the buffer compensation circuit 1300 is used to compensate for buffer variability.

As with the buffer compensation circuit 1200, three measurements are required to remove buffer variability from the phase detector output in the buffer compensation circuit 1300. The first measurement, TPD1, measures the delay from the far-end LO clock source through the far-end transmit buffer 1331, a interconnect trace 1322, a near-end receive buffer 1323, and the multiplexer 1327. The second measurement, TPD2, loops back the local LO clock through the near-end transmit buffer 1321, the near-end receive buffer 1323, and the multiplexer 1327. The third measurement, TPD3, measures the delay of replica buffer by looping the input of the local transmit buffer 1321 back through the replica buffer 1326, and the multiplexer 1327. The final phase detector output is calculated as TPD0=TPD1+TPD2−2·TPD3, and represents the sum of delays of the two transmit buffers 1321, 1331 and the trace 1322. In this embodiment, the removal of one replica buffer removes one source of random uncertainty from the final result, and the use of only one PCB trace removes the requirement to match two traces, which simplifies the system implementation.

The systems of FIG. 8 through FIG. 11 describe two-antenna systems with two local LO clock generators. Scaling these systems to drive more antennas can be done in at least two ways. A first approach includes each synchronized LO generator driving multiple paths. In a highly-integrated system, where multiple paths are integrated into the same integrated circuit, this is relatively straight-forward because there are no long PCB traces or connectors to deal with. However, when larger systems are being built that involve multiple integrated circuits on a larger PCB or involve connectors the engineering challenges associated with aligning multiple full-rate LO phases at multiple destinations that have been fanned out from a common LO clock source are the same as before. As a result, building a large system with this approach may not be desirable.

A second approach includes building networks of LO clock synchronization blocks to enable building large systems that cross multiple integrated circuits on one PCB or cross multiple PCB's through connectors. In order to construct such networks, each path requires two or more LO clock synchronization ports. Such ports can be constructed using either the uni-directional structure of FIGS. 10 and 12 or the bi-directional structure of FIGS. 11 and 13. These synchronization ports can be either tiled multiple times as-is or optimized further.

Figure 14:
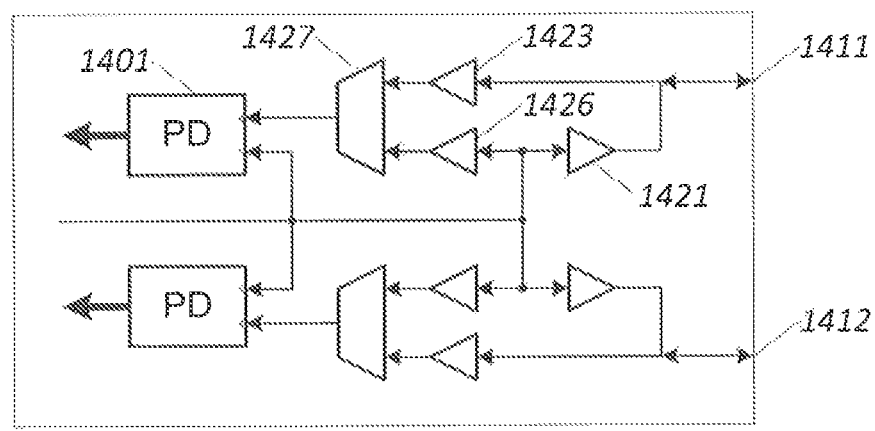
FIG. 14 is an un-optimized system having two local oscillator clock synchronization ports, in accordance with an embodiment.

FIG. 14 illustrates two independent and un-optimized LO synchronization ports 1411, 1412. Each LO synchronization port 1411, 1412 has an independent transmit buffer 1421, a receive buffer 1423, a replica receive buffer 1426, a multiplexer 1427, and a phase detector 1401.

Figure 15:
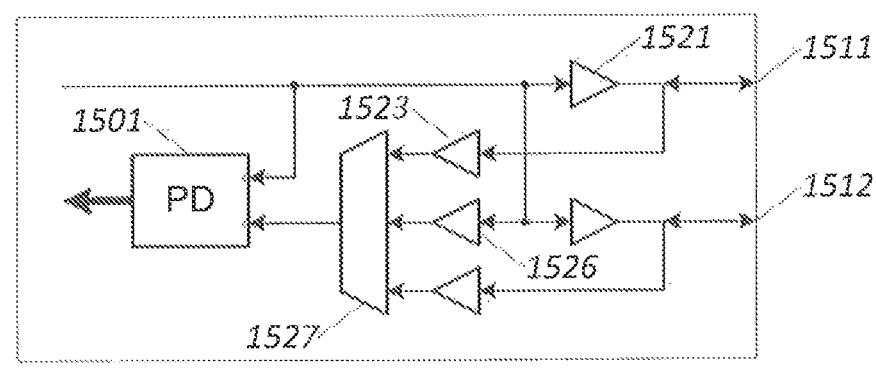
FIG. 15 is an optimized system having two local oscillator clock synchronization ports, in accordance with an embodiment.

FIG. 15 illustrates two combined and optimized LO synchronization ports 1511, 1512. As with the two independent and un-optimized LO synchronization ports 1411, 1412, each port 1511, 1512 has separate transmit and receive buffers 1521, 1523. However all ports share a replica receive buffer 1526, a multiplexer 1527, and a phase detector 1501. In an embodiment, the common circuitry is time-interleaved in software, as the PLL bandwidths for performing the LO synchronization operation are low.

Using techniques such as described with reference to FIG. 15, the circuit overhead in each path for constructing multiple LO synchronization ports to build LO synchronization networks can be minimized.

Figure 16:
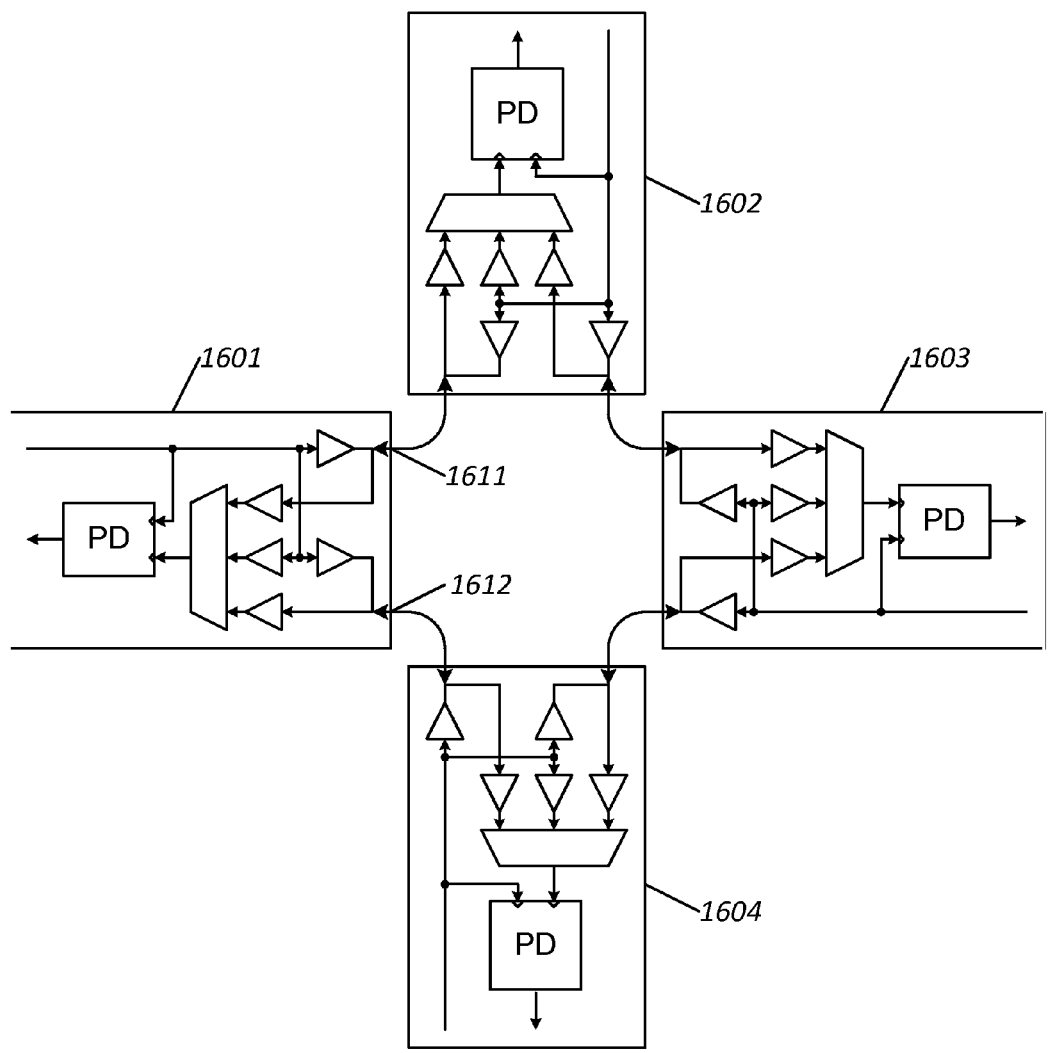
FIG. 16 is a four path local oscillator alignment system using ring topology, in accordance with an embodiment.

FIG. 16 illustrates a 4-path LO alignment 1600 using the ring topology. The 4-path LO alignment 1600 allows each path 1601, 1602, 1603, 1604 to measure its alignment with its two neighboring paths. Each path 1601, 1602, 1603, 1604 has a separate LO clock generator and two LO synchronization ports 1611, 1612. The LO synchronization ports 1611, 1612 are built using the optimized bi-directional structure of FIG. 15. In an alternative, the LO synchronization ports 1611, 1612 are built using another structure described herein.

The ring topology may be expanded to more than four paths by cascading more paths in sequence. In alternative embodiments with multiple LO synchronization ports per path, alternative LO synchronization network topology may be constructed using example topologies from graph theory, including the daisy chain, star, hypercube, and fully-connected topologies, as well as hybrid topologies.

The phase detectors described with reference to FIGS. 9 to 16 may be a block that produces a digital output proportional to the time delay between its two inputs, often known as "trigger" and "target" inputs, also known as a time to digital converter (TDC). Conventional TDCs may be designed to produce outputs at relatively high speed, ranging from MHz up to GHz speeds. In contrast, the LO clock synchronization application described herein may not need high conversion rates. As such it may be desirable to provide a low-complexity and low-power alternative phase detector optimized for this application.

Figure 17:
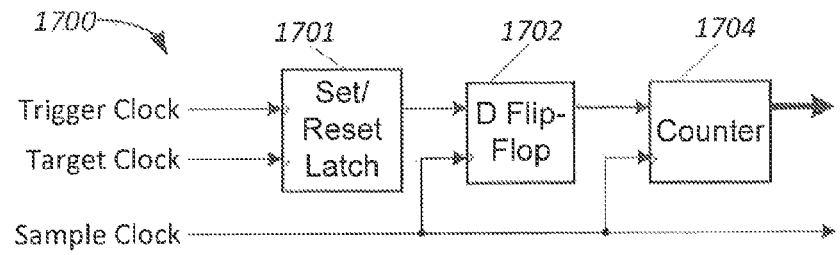
FIG. 17 is a low complexity time to digital converter, in accordance with an embodiment.

FIG. 17 illustrates a low-complexity time to digital converter (TDC) 1700, in accordance with an embodiment. The low-complexity time to digital converter 1700 has relatively modest complexity, and includes an edge-triggered set/reset latch 1701, a D flip-flop 1702, and a fully digital counter 1704. The fully digital counter 1704 counts the number of "ones" coming from the D flip-flop 1702.

The set/reset latch 1701 uses the rising edges of the trigger clock as a "set" signal and the rising edge of the target clock as a "reset" signal. As a result, the output from the set/reset latch 1701 is "high" for a period equal to the delay between the trigger and target clocks. This output is then sampled by a sample clock. The sample clock is a third clock with a frequency such that the sample clock edges process through the period of the trigger and target clocks, effectively oversampling the latch output by a large factor. The digital counter 1704 then counts the number of "ones" present at the D flip-flop 1702 output for one complete cycle of this precession, producing a direct digital proportional measurement of the delay between the trigger and target clocks.

Figure 18:
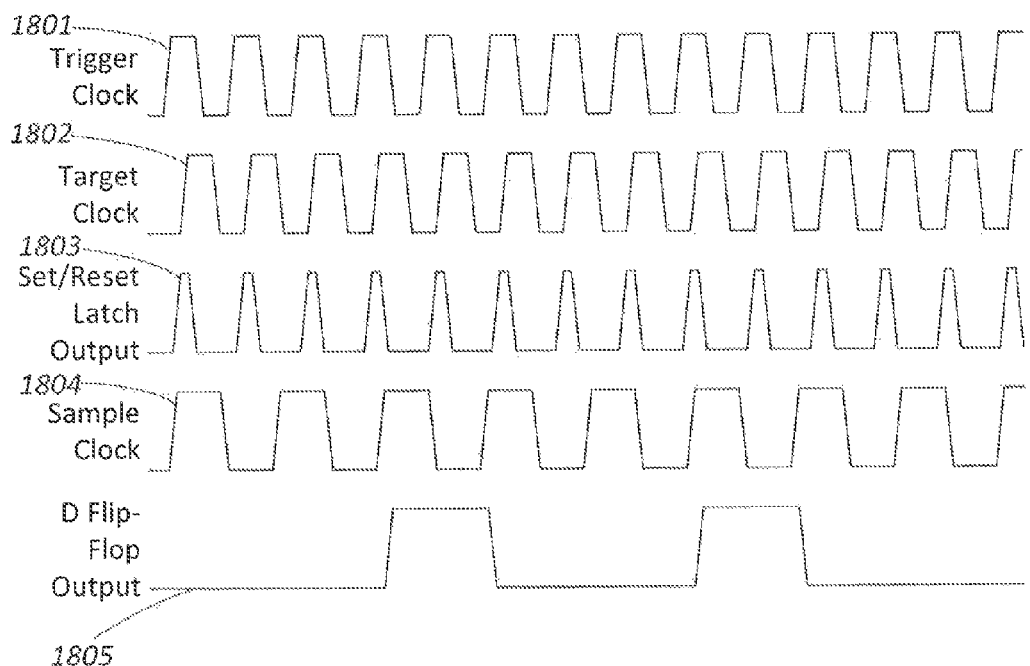
FIG. 18 illustrates time to digital converter functional timing, in accordance with an embodiment.

FIG. 18 illustrates a time to digital converter 1800 with functional timing, in accordance with an embodiment. The TDC 1800 includes a trigger clock 1801, a target clock 1802, a set/reset latch output 1803, a sample clock 1804, and a D flip-flop output 1805.

Where both the trigger and target clock frequency and the sample clock frequency is expressed as rational fractions of a common reference clock (Ftrigger=Fref*(n1/d1) and Fsample=Fref*(n2/d2)), then how many sample clock periods it will take for the two clock frequencies to process with respect to each other may be determined from Nsample=(d1*d2)/gcd(d1,d2). Where the counter 1704 is run for exactly Nsample cycles, the TDC resolution (in seconds) is given Ttdc=1/(Ftrigger*Nsample).

This conceptual approach may have flip-flop setup and hold margins that are stressed by extremely narrow pulses coming out of the set/reset latch 1701 when measuring extremely small delays and flip-flop metastability.

Figure 19:
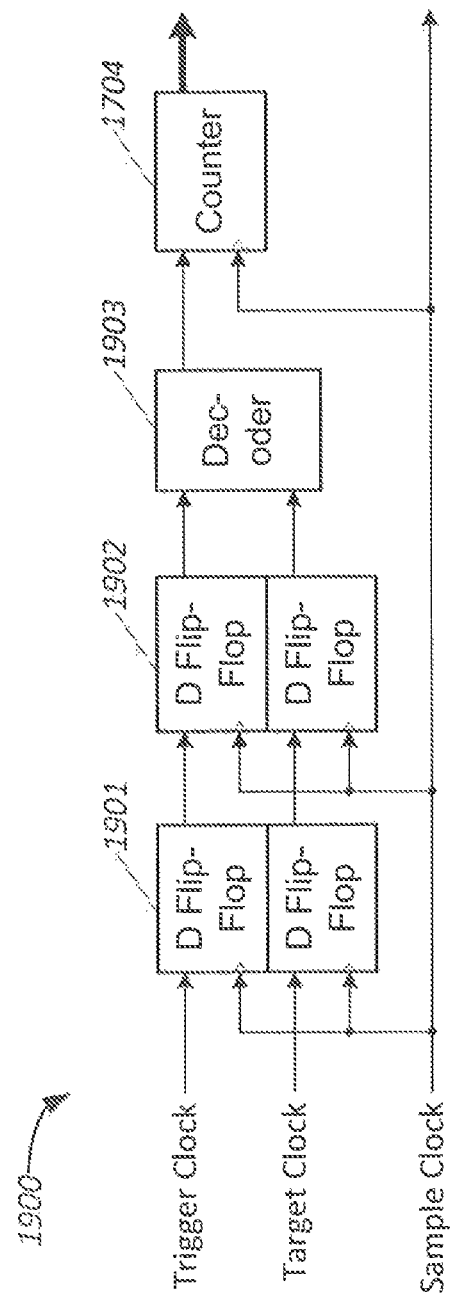
FIG. 19 is an enhanced low-complexity time to digital converter, in accordance with an embodiment.

FIG. 19 illustrates an improved low-complexity time to digital converter 1900, in accordance with an embodiment. Instead of an edge-triggered set/reset latch, the improved low-complexity time to digital converter 1900 has both trigger and target clocks sampled directly on flip-flops 1901, with additional flip-flops 1902 used for metastability rejection. The improved low-complexity time to digital converter 1900 has a decoder 1903 for observing the flip-flop outputs, producing a "one" when it is determined that the front-end has sampled in the time between trigger and target clock rising edges, and again the counter 1704 produces a digital proportional signal output.

The improved low-complexity time to digital converter 1900 may not suffer from narrow pulses when measuring short delays. The inclusion of additional series flops rejects metastability. In a further embodiment, additional flip-flops are added to further improve metastability rejection.

For a range wider than 180 degrees, the decoder 1903 may be replaced with a state machine that changes the output to 1 every time the trigger clock is rising and to 0 every time the target clock is rising. Depending on the ratio between the trigger and target clock frequency and the sample clock frequency, ranges as wide as 360 degrees may be achieved. Impairments such as the jitter on any of the clocks may reduce the measurable range.

The sample clock frequency (Fsample) and the number of cycles to count the output over (n2, and d2) are selected based on measurement accuracy requirements (n1 and d1). Generating the sample clock may include an additional system clock generator (such as a PLL). An additional system clock may already be used for another purpose (for example, to drive an embedded microprocessor core running supervisory software and perhaps the LO synchronization software loop filter) such that a specific clock generator for this purpose may not be necessary.

There may be a discontinuity where the time to digital converter measurement exceeds its maximum range and wraps back around to zero. As the LO phases between two devices are generally random when starting, it may be possible that the measured phase between two devices, TPD1, falls on this discontinuity, resulting in erroneous measured values.

Figure 20:
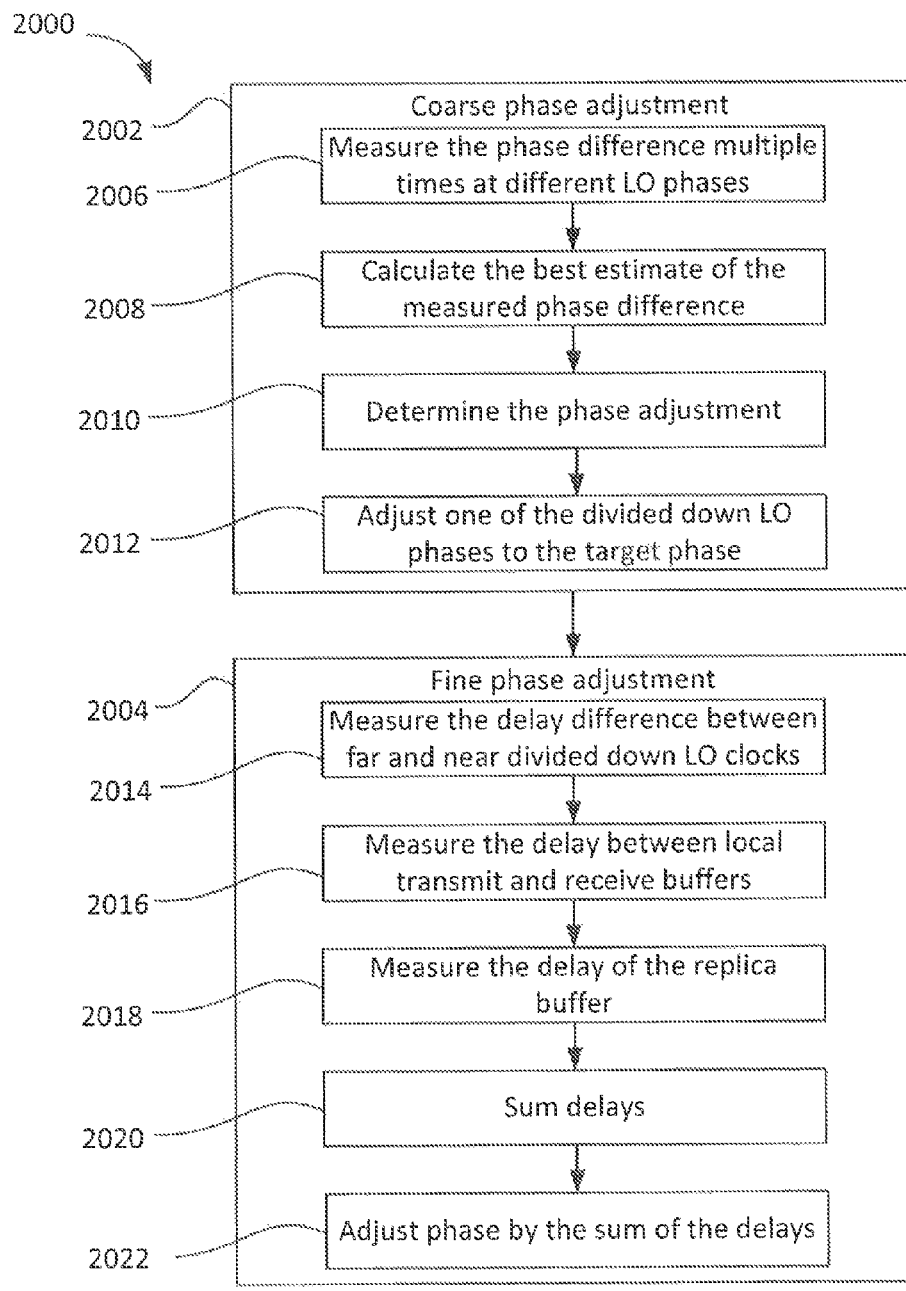
FIG. 20 is flow chart of a method for phase adjustment, in accordance with an embodiment.

FIG. 20 illustrates a method for phase adjustment 2000. The phase adjustment method 2000 may increase the reliability of the phase measurement. The phase adjustment includes a coarse phase adjustment 2002 and a fine phase adjustment 2004. The coarse phase adjustment 2002 includes making a sequence of measurements and calculations in order to make a coarse phase adjustment. The objective of the course phase adjustment 2002 is to ensure that subsequent TPD1 measurements are as far away from the discontinuous region as possible and in the most linear region possible.

To be more specific the algorithm can be described in more detail. The following variables are defined:

TPD1$j$—Reliable TPD1 phase measurement at device j;

$\phi d$—phase due to the propagation delay along the path between RF path 1 and 2;

b—initial offset between TPD1 measurement and phase of divided down LO;

Bk—best estimate of b;

Dk—TPD1 phase measurement, where k denotes the kth measurement instance;

Pk—phase of divided down LO, where k denotes the kth measurement instance;

Pkj—phase of divided down LO, where k denotes the kth measurement instance, and where j denotes the jth device; and $ek^2$—squared error of Bk.

From the above discussion: Dk=Pk+b.

In the coarse phase adjustment 2002, at 2006, for each RF path, the TPD1 is measured multiple times at different LO phases, and the best estimate of the initial divided down LO phase is calculated. Dk is measured at several equally spaced phases. In an embodiment, 6 equally spaced phases Pk are used: where, P0=0°, P1=60°, P2=120°, P3=180°, P4=240°, P5=300°. The LO is adjusted such that the phase returns to the same initial phase.

At 2008, at most, one of the Pks is in the discontinuous region. It is determined which 5 give the smallest estimation error. The best estimate of b is the mean of all of the (Dk−Pk), while leaving out one of the measurements that is supposed in error. Bk=((D0−P0)+ . . . +(D5−P5))/5, kth term left out. The Bk that gives the smallest squared error, $ek^2$ is found, where: $ek^2=(Bk-(D0-P0))^2+ \ldots +(Bk-(D5-P5))^2$, kth term left out. The best Bk is also the best estimate of TPD1j, since adjust 6×60°, which is full circle back to phase P0=0. 2008 is repeated for each RF path, and the best estimates of TPD11 and TPD12 are used in 2010.

At 2010, the phase adjustment that will maximize the distance to the discontinuity near 0° phase is determined. The phase of one of the devices is adjusted by this amount at 2012.

The relationship between the phase measurements and can be derived by looking at the circuit and path delay: TPD11=P01−(P02−φd), and TPD12=P02−(P01−φd). The TPD11 and TPD12 equations are symmetrical. Due to the symmetrical nature of the above equations, a change in either the phase of the divided down LO in RF path 1 or RF path 2 moves TPD11 and TPD12 in opposite and equal directions.

In order to ensure TPD11 and TPD12 are as far away from 0 phase as possible, either LO is adjusted such that TPD11 and TPD12 equal TPD1, the target phase is adjusted until they are the same. Otherwise one of the measurements may be closer to 0 phase than the other one. To find the target phase, the two measurements are averaged: TPD1=(TPD11+TPD12)/2.

Where the ratio between the LO and the divided down LO is 2 or any even number, the target phase is away from the discontinuous region by moving the target phase 180°. Where the target phase above is between −180 and +180°, modulo 180° is added to obtain a new target phase that is away from the discontinuous region: if (−90°<TPD1<0°), TPD1=TPD1+180° if (0°<TPD1<+90°), TPD1=TPD1−180°.

At 2012, one of the divided down LO phases is added to the target phase. Where device 2 is adjusted: Padjust=TPD11−TPD1. When adjusted by Padjust, as described, the LOs will be also aligned.

At 2004, the fine phase adjustment is performed. The fine phase adjustment 2004 includes making a sequence of measurements and calculations to make a fine, more accurate, phase adjustment. The fine phase adjustment 2004 makes use of the TPD2 and TPD3 measurements used for buffer variability compensation as described with reference to FIG. 12. At 2014, the delay difference between the far and near divided down clocks is measured. At 2016, the delay between local transmit and receive buffers is measured. At 2018, the delay of the replica buffer is measured. At 2020, the delays are summed. At 2022, the LO clocks are adjusted by the sum of the delays.

Figure 21:
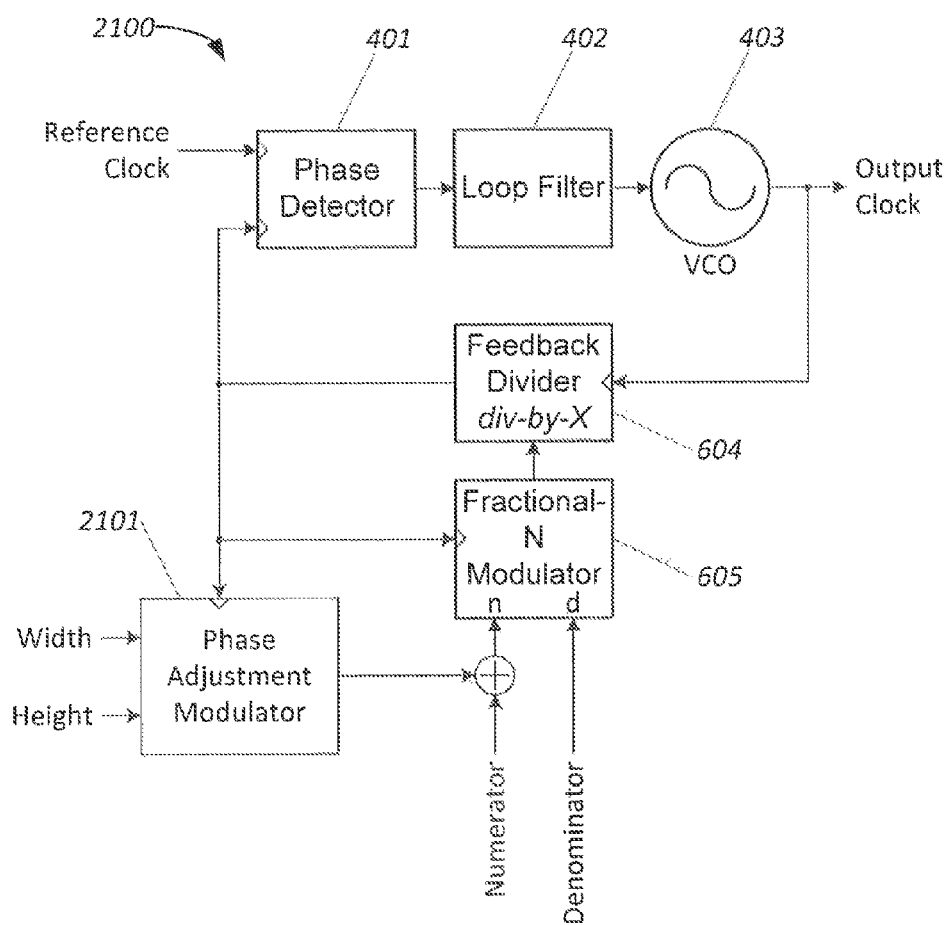
FIG. 21 is a fractional-N phase-locked loop with software phase manipulation, in accordance with an embodiment.

FIG. 21 illustrates software phase manipulation of a fractional-N PLL 2100. In order to enable the use of software for implementing the loop filter of an LO synchronization port, a phase adjustment modulator 2101 is provided to allow software to readily control the phase of a fractional-N phase locked loop. The phase adjustment modulator 2001 is added to the already-existing blocks 401, 402, 403, 604, 605, as described with reference to FIG. 6. The phase adjustment modulator 2101 takes two inputs, a width, and a height. An output of the phase adjustment modulator 2101 is summed together with the fractional-N numerator. Normally, the phase adjustment modulator 2101 produces a zero output, but when triggered, it produces height (h) for width (w) reference clock cycles, returning to zero afterwards. As a result, the phase of the output clock is shifted by (w·h)/d of a period in one software-controlled operation. By making h/d small, the phase change every reference clock signal can also be made small, minimizing phase noise at the output created by this phase modulation.

The distributed phase detection systems described with reference to FIGS. 9 to 11 have the synchronization channel 925 for distributing the outputs from one path's phase detector to the other path's loop filter. As described, this synchronization channel takes the form of a low-speed multiplexed microprocessor peripheral bus, which implies that there is a central coordinating microprocessor. Where each path has no local microprocessor to implement the LO synchronization algorithm, this central microprocessor is responsible for implementing all LO synchronization algorithms for all paths.

Where each path has a local microprocessor to offload the central processor and perform the LO synchronization, the central microprocessor's workload is reduced to reading register values from one path's phase detector output and writing them into the other path's loop filter input. Depending upon a number of factors, where the workload becomes a bottleneck, an alternate synchronization channel is created.

In an embodiment, a data signal is embedded in the LO synchronization signal. As described to this point, the LO synchronization signal is either a pair of uni-directional clocks or a single bi-directional clock, however in other application spaces, such as telecommunication, clocking information is regularly encoded in data streams. A simple and widely-used scheme for encoding data streams, Manchester Coding, has low-complexity encoding and decoding circuits. This encoding may be embedded in the already-existing transmit/receive buffers of an LO synchronization port. It also maintains a DC-balanced signal, which allows ready AC coupling of the synchronization channel. Other encoding techniques may be used, including pseudorandom bit sequence (PRBS) scrambling, 8B/10B coding, or multi-level coding, however the added complexity and power of decoding these signals and extracting the phase information from them may make their use unattractive or prohibitive.

The present disclosure provides a large multi-path multi-antenna RF system. The system may reduce power required to distributing full-speed LO clocks to multiple paths. System design effort may be reduced in order to match trace lengths for distributing full-speed LO clocks to multiple paths. Variability may be reduced, both systematic and environmental, in LO clock alignment between multiple paths. The system may provide the ability to scale from two aligned paths to a much larger number of paths by building networks of LO clock synchronization ports.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A time to digital converter comprising:
   a D flip-flop for sampling first and second input clocks with a third clock; and
   a counter configured to synchronously increment the resulting samples and create a digital proportional value representing the delay between the first and second clocks.

2. The time to digital converter of claim 1, further comprising:
   a set-reset latch for receiving the first and second input clocks;
   wherein the first and second input clocks are trigger and target clocks as edge-triggered set and reset inputs to the set-reset latch; and
   wherein the set-reset latch output is sampled with the third clock.

3. The time to digital converter of claim 1, further comprising:
   a decoder to detect sampled inputs where the first clock leads the second clock.

4. The time to digital converter of claim 1, wherein a frequency of the third clock is selected to ensure that clock edges of the third clock process through a period of the first and second clocks, such that phase detector resolution is optimized.

5. The time to digital converter of claim 1, wherein a number of cycles to count the sampled clocks is selected such that phase detector resolution is optimized.

6. The time to digital converter of claim 1, wherein a phase discontinuity of the time to digital converter is detected to determine a lock point and prevent a false lock.

7. A method of time to digital conversion, comprising:
   sampling first and second input clocks with a third clock;
   using the resulting samples to synchronously increment a counter; and
   creating a digital proportional value representing the delay between the first and second clocks.

8. The method of claim 7, further comprising:
   using trigger and target clocks as edge-triggered set and reset inputs to a set-reset latch; and
   sampling the latch output with the third clock.

9. The method of claim 7, further comprising:
   detecting sampled inputs with a decoder where the first clock leads the second clock.

10. The method of claim 7, further comprising:
    determining a frequency of the third clock to ensure that clock edges of the third clock process through a period of the first and second clocks, such that phase detector resolution is optimized.

11. The method of claim 7, further comprising:
    determining a number of cycles to count the sampled clocks such that phase detector resolution is optimized.

12. The method of claim 7, further comprising:
    detecting a phase discontinuity to determine a lock point and prevent a false lock.

* * * * *